US011485818B2

(12) United States Patent
Govindarajan et al.

(10) Patent No.: US 11,485,818 B2
(45) Date of Patent: Nov. 1, 2022

(54) RADIATION CURABLE COMPOSITIONS FOR ADDITIVE FABRICATION

(71) Applicant: Covestro (Netherlands) B.V., Nieuwegein (NL)

(72) Inventors: Sudhanva Govindarajan, Elgin, IL (US); Marco Marcus Matheus Marcus Matheus Driessen, Echt (NL)

(73) Assignee: Covestro (Netherlands) B.V., Geleen (NL)

( * ) Notice: Subject to any disclaimer, the term of this patent is extended or adjusted under 35 U.S.C. 154(b) by 150 days.

(21) Appl. No.: 17/048,625

(22) PCT Filed: Apr. 22, 2019

(86) PCT No.: PCT/US2019/028504
§ 371 (c)(1),
(2) Date: Oct. 19, 2020

(87) PCT Pub. No.: WO2019/204807
PCT Pub. Date: Oct. 24, 2019

(65) Prior Publication Data
US 2021/0238339 A1 Aug. 5, 2021

Related U.S. Application Data

(60) Provisional application No. 62/660,621, filed on Apr. 20, 2018.

(51) Int. Cl.
*C08F 2/46* (2006.01)
*C08F 2/50* (2006.01)
*C08G 61/04* (2006.01)
*C08G 18/42* (2006.01)
*B33Y 10/00* (2015.01)
*B33Y 70/00* (2020.01)
*B33Y 80/00* (2015.01)
*B29C 64/129* (2017.01)
*C08G 18/48* (2006.01)

(52) U.S. Cl.
CPC ........ *C08G 18/4277* (2013.01); *B29C 64/129* (2017.08); *B33Y 10/00* (2014.12); *B33Y 70/00* (2014.12); *B33Y 80/00* (2014.12); *C08G 18/4833* (2013.01); *C08G 2115/00* (2021.01)

(58) Field of Classification Search
CPC ......... B33Y 10/00; B33Y 80/00; B33Y 70/00; B29C 64/129; G03F 7/0037; G03F 7/0027; C08G 18/4833; C08G 18/4277; C08G 2115/00
USPC ..................... 522/93, 90, 1; 520/1
See application file for complete search history.

(56) References Cited

U.S. PATENT DOCUMENTS

| 5,418,112 | A | 5/1995 | Mirle |
| 5,476,749 | A | 12/1995 | Steinmann |
| 6,025,114 | A | 2/2000 | Popat |
| 7,232,646 | B2 | 6/2007 | Klare |
| 7,358,283 | B2 | 4/2008 | Xu |
| 7,514,477 | B2 | 4/2009 | Klare |
| 7,851,122 | B2 | 12/2010 | Napadensky |
| 8,106,107 | B2 | 1/2012 | Napadensky |
| 8,481,241 | B2 | 7/2013 | Napadensky |
| 8,716,425 | B2 | 5/2014 | Stewart |
| 8,883,392 | B2 | 11/2014 | Napadensky |
| 9,228,073 | B2 | 1/2016 | He |
| 9,456,963 | B2 | 10/2016 | Lee |
| 9,708,442 | B1 | 7/2017 | Kwisnek |
| 2002/0151615 | A1* | 10/2002 | Tortorello ............... C09D 4/00 522/96 |
| 2008/0287564 | A1 | 11/2008 | Klare |
| 2010/0092691 | A1 | 4/2010 | Patel |
| 2010/0304088 | A1 | 12/2010 | Steeman |
| 2014/0167300 | A1 | 6/2014 | Lee |
| 2017/0007362 | A1 | 1/2017 | Chen |

(Continued)

FOREIGN PATENT DOCUMENTS

| EP | 0820609 A1 | 1/1998 |
| EP | 2053065 B1 | 12/2010 |
| EP | 2774954 A1 | 9/2014 |

(Continued)

OTHER PUBLICATIONS

Streyrer et al., Hot Lithography vs. room temperature DLP 3D-printing of a dimethacrylate,, Additive Manufacturing, 20108, pp. 209-214, 21.

(Continued)

*Primary Examiner* — Jessica Whiteley

(74) *Attorney, Agent, or Firm* — Jed C. Benson

(57) ABSTRACT

Described herein are thermoset compositions and kits of compositions suitable for use in additive fabrication processes including high concentrations of urethane methacrylate oligomers having at least one polymerizable group, and a number average molecular weight from 750 to 4000 g/mol, an effective quantity of a monofunctional reactive diluent monomer, a defined concentration of a network building agent having a molecular weight that is lower than the urethane methacrylate oligomer, optionally a photoinitiator, and optionally, additives. Also disclosed are methods of creating three-dimensional parts via additive fabrication processes utilizing urethane methacrylate oligomer-centric compositions, wherein various exposure irradiances, cure temperatures, and oxygen content levels are prescribed, as well as the articles cured therefrom.

32 Claims, 2 Drawing Sheets

(56) References Cited

U.S. PATENT DOCUMENTS

2017/0121542 A1    5/2017  Xu
2019/0136079 A1    5/2019  Moussa

FOREIGN PATENT DOCUMENTS

| EP | 3040046 B1 | 4/2018 | |
|----|----|----|----|
| WO | 2016153711 A1 | 9/2016 | |
| WO | 2017112653 A1 | 6/2017 | |
| WO | WO-2017112653 A1 * | 6/2017 | ........... B29C 64/124 |
| WO | 2019070587 A1 | 4/2019 | |
| WO | 2019133999 A1 | 7/2019 | |

OTHER PUBLICATIONS

International Search Report dated Jul. 26, 2019.
Written Opinion dated Jul. 26, 2019.

* cited by examiner

RADIATION CURABLE COMPOSITIONS FOR ADDITIVE FABRICATION

CROSS-REFERENCE TO RELATED APPLICATIONS

This application is a U.S. national phase entry under 35 USC § 371 of international application, PCT/US2019/028504, filed 22 Apr. 2019, which designated the U.S. and claims priority to U.S. Provisional Application No. 62/660,621, filed 20 Apr. 2018, the entire content of each of which is hereby incorporated by reference in its entirety as if set forth fully herein.

CROSS-REFERENCE TO RELATED APPLICATIONS

This application claims priority to U.S. Provisional Application No. 62/660,621, filed 20 Apr. 2018, the entire contents of which is hereby incorporated by reference in its entirety as if fully set forth herein.

TECHNICAL FIELD

The invention relates to methacrylate oligomer-containing thermosetting compositions and methods for producing three-dimensional objects by additive fabrication techniques, and articles produced therefrom.

BACKGROUND

Additive fabrication processes for producing three dimensional objects are well known. Additive fabrication processes utilize computer-aided design (CAD) data of an object to build three-dimensional parts. These three-dimensional parts may be formed from liquid resins, powders, or other materials.

Various types of materials are used in additive fabrication processes. Generally, thermoplastic materials are used in, for example fused filament fabrication (FFF) and selective laser sintering (SLS) processes, whereas thermoset materials are used in, tier example vat-based processes and processes that involve jetting of liquid materials.

Generally, electromagnetic radiation is used to induce rapid curing of the thermosetting materials. The electromagnetic radiation may be UV, visible, or infrared light and may be applied, for example, by lasers, lamps, or LEDs. The electromagnetic radiation may be applied selectively, e.g. by drawing a specific pattern with a laser, using a digital micromirror device (DMD), or a mask, or unselectively, e.g. by passing a lamp over the entirety of a surface. Post-processing by applying additional temperature or light to the newly formed three-dimensional object may be necessary to achieve the desired properties of a three-dimensional object formed from a thermosetting composition.

A well-known, non-limiting example of a vat-based additive fabrication process is stereolithography Stereo lithography is a process for rapidly producing models, prototypes, patterns, and production parts in certain applications. SL uses CAD data of an object wherein the data is transformed into thin cross-sections of a three-dimensional object. The data is loaded into a computer which controls a laser that traces a pattern of a cross section through a liquid radiation curable resin composition contained in a vat, solidifying a thin layer of the resin corresponding to the cross section. The solidified layer is recoated with resin and the laser traces another cross section to harden another layer of resin on top of the previous layer. The process is repeated layer by layer until the three-dimensional object is completed. When initially formed, the three-dimensional object is, in general, not fully cured, and is called a "green model." Although not required, the green model may be subjected to post-curing to enhance the mechanical properties of the finished part.

Many classes of thermosetting materials have been used in additive fabrication processes. One well-known class suitable for use in additive fabrication systems is a "hybrid" curable resin, or one that comprises: (1) epoxies, oxetanes, or other types of cationically polymerizable compounds; (2) one or more cationic photoinitiators; (3) acrylate resins or other types of free radical polymerizable compounds; and (4) one or more free radical photoinitiators. Such resins have become popular for applications requiring cured parts produced via additive fabrication processes with superior mechanical properties that approach engineering thermoplastics. Furthermore, hybrid curable systems are used wherein part warping, curl, or differential shrinkage is desired to be minimized.

Various advances have been made to hybrid-curable thermosetting materials for additive fabrication, either to improve the mechanical properties of the finished article, or to increase the number of additive manufacturing systems into which such systems may be incorporated. For example, US2010/0304088 describes a radiation curable resin composition comprising cationically polymerizable components and an impact modifier that, after full cure, results in a material having a high tensile modulus and high toughness, as shown by high impact strength and/or high resistance against crack propagation. U.S. Pat. No. 9,228,073 describes "filled" hybrid-curable materials that exhibit superior strength, stiffness, and high temperature resistance. U.S. Pat. No. 9,708,442 describes hybrid-curable materials that are sufficiently fast curing in more modern additive manufacturing systems incorporating LED or DLP-based UV/vis optics.

However, the ring-opening mechanism of cationic polymerization generally occurs relatively slowly, and requires a relatively high degree of activation energy, such that these systems require relatively high doses of actinic radiation to cure sufficiently quickly, and in any event could suffer from long-term liquid stability problems due to the "living" nature of the cationic polymerization mechanism. Another drawback of hybrid-curable systems is their lack of ready biocompatibility. Also, such systems may be tuned for high heat resistance or toughness, but it is challenging to tune such resins to perform exceptionally well in both such areas simultaneously. Finally, such systems often produce three-dimensional articles which exhibit yellowing over long-term exposure to UV light.

Purely free-radically polymerizable type materials have been known and used even longer than the aforementioned hybrid-based systems in additive fabrication processes. Such radically-polymerizable systems generally consist of one or more acrylate compounds (or other free-radical polymerizable organic compounds) along with a free-radical photoinitiator for radical generation. U.S. Pat. No. 5,418,112 describes one such radical-curable system. Although acrylate-containing compounds readily cure under even the relatively lower energy and lower intensity, they are not suitable for all additive fabrication applications. First, acrylate-based resins considered suitable for additive fabrication processes have traditionally produced brittle cured parts with insufficient mechanical properties to be incorporated into many end-use applications. Also, such resins typically exhibit problems of deformation, such as production of warped or malformed parts, because of residual strain due to the differential shrinkage during curing. Such problems are exacerbated on larger-platform additive fabrication machines, wherein the cumulative differential shrinkage effect amplifies part warping or malformation as cured objects become larger.

Although preferred from a biocompatibility standpoint, methacrylate-based free-radical polymerizable systems useable in additive fabrication processes have traditionally also yielded cured articles with inferior mechanical properties and increased differential shrinkage when compared with leading hybrid-curable materials. Furthermore, they exhibit inferior cure speed and comparable brittleness when compared to all-acrylate containing systems.

From the foregoing, it is evident that a heretofore unmet need exists to provide radiation curable materials for additive fabrication processes which are capable of ready printability in existing additive fabrication processes, and also yield cured articles with superior mechanical properties while simultaneously enabling improved biocompatibility. An example of existing additive fabrication processes includes top-down, open-vat SLA or DLP processes. An example of cured articles with superior mechanical properties would be those exhibiting simultaneous enhanced toughness and Tg. It would further be desirable to provide a platform of biocompatible materials which are readily-tunable so as to facilitate the creation of three-dimensional cured articles with a wide range of properties to accommodate the differing requirements of a variety of end-use applications.

BRIEF SUMMARY

Described herein are several embodiments of the invention. According to a first aspect, the invention employs a radiation curable composition for additive fabrication comprising (a) from 40 to 95 wt. % of a urethane methacrylate oligomer having at least one polymerizable group. The urethane methacrylate oligomer is the reaction product of a diisocyanate, a polyol, and a hydroxy-functional methacrylate, and further possesses a number average molecular weight of from 750 to 4000 g/mol. In an embodiment, the oligomer and/or isocyanate reactant may be aliphatic, and the polyol may include a polycaprolactone diol with a primary hydroxyl group. In an embodiment, the urethane methacrylate oligomer may possess between an average of 0.9 to 3.1 polymerizable groups, which polymerizable groups may comprise or consist of methacrylate groups. In an embodiment, the urethane methacrylate oligomer possesses an uncured Tg, as measured by differential scanning calorimetry, of less than 25° C., or less than 20° C., or less than 10° C., or less than 0° C., or from −40° C. to 20° C., or from −25° C. to 20° C., or from −15° C. to 20° C.

The radiation curable composition described in the first aspect also comprises (b) an effective quantity of a reactive diluent monomer. The reactive diluent monomer may comprise a number average of 0.9 to 1.1 polymerizable groups. In an embodiment, the diluent monomer may further include a urethane methacrylate compound.

The radiation curable composition described in the first aspect also comprises (c) from 2 to 20 wt. %, or from 5 to 20 wt. %, or from 8 to 20 wt. %, or from 5 to 15 wt. %, or from 5 to 12 wt. %, based on the total weight of the composition, of a methacrylate-functional network building agent (NBA) comprising a number average of greater than 1.5 polymerizable groups; wherein the methacrylate-functional NBA has a number average molecular weight that is less than the number average molecular weight of the urethane methacrylate oligomer, but more than the Mn of the reactive diluent. The NBA may contain, in an embodiment, an average of from 1.9 to 3.1 functional (methacrylate) groups, and possess a Mn of less than 750 g/mol. In another embodiment, the NBA may further comprise urethane methacrylate compounds—which may be tin-free—having a molecular weight from 150 to 750 g/mol. In yet further embodiments, the NBA may possess an amide, carbamide, ester, hydroxyl, urea, or urethane group, or alternatively at least two aromatic groups. Such NBA may as an alternative possess at least two hydrogen bond donor sites not otherwise present in a methacrylate group.

The radiation curable composition described in the first aspect also comprises (d) optionally, one or more photoinitiators; and (e) optionally, one or more additives.

The present invention also includes a second aspect describing a method of producing a three-dimensional part via an additive fabrication process, the method comprising providing a first layer of a radiation curable composition, wherein the composition is described as being any of the embodiments of the first aspect of the invention. In an embodiment, the composition is predominantly (i.e. >50 wt. %) comprised of one or more urethane methacrylate oligomers, in order to form a first surface. In an embodiment, the glass transition temperature of a linear polymer formed from one or more of the urethane methacrylate oligomers may be between 30° C. to 100° C. In another embodiment, the composition may be any of those described or defined by any of the embodiments according to the first aspect of the invention. In an embodiment, the layer is provided in an oxygen-rich environment, for example, such as a top-down SLA or DLP printing process.

The method of the second aspect also comprises an optional step of heating at least a portion of the first layer of the radiation curable composition. In an embodiment, the heating step is controlled such that at least a portion of the composition or layer is heated to within specified ranges at or just below the glass transition temperature of one or more of the urethane methacrylate oligomers. In an embodiment, the layer is heated to a temperature that is less than or equal to, and within 10 degrees of, the glass transition temperature of at least one of the urethane methacrylate oligomers.

The method of the second aspect also comprises the step of exposing at least a portion of the first layer of the radiation curable composition imagewise to actinic radiation to form a cured cross-section. In an embodiment, the exposing step is carried out so as not to impart any irradiance greater than 200 W/cm$^2$ at the portion of the first layer.

The method of the second aspect also comprises the further steps of providing an additional layer of a radiation curable composition onto at least a portion of the cured cross-section to form an additional layer of the radiation curable composition, and then exposing at least a portion of the additional layer of the radiation curable composition imagewise to actinic radiation to form an additional cured cross-section. The above-recited steps may be repeated several times sufficient to form the complete shape of the three-dimensional object to be built.

A third aspect of the invention involves a three-dimensional article, wherein such component was created via any of the methods described in any of the embodiments according to the second aspect of the invention and is the cured product of the compositions described in any of the embodiments according to the first aspect of the invention. In an embodiment, the three-dimensional article possesses specified tensile modulus, elongation at yield, flexural strength, heat deflection temperature, and/or water absorption values. In another embodiment, the three-dimensional article exhibits biocompatibility characteristics, as determined by superior cytotoxicity performance, when tested according to ISO 10993-5.

The components of the composition may also be separated and provided as a kit of materials. Further embodiments of the invention are described below.

DETAILED DESCRIPTION

Figure 1:
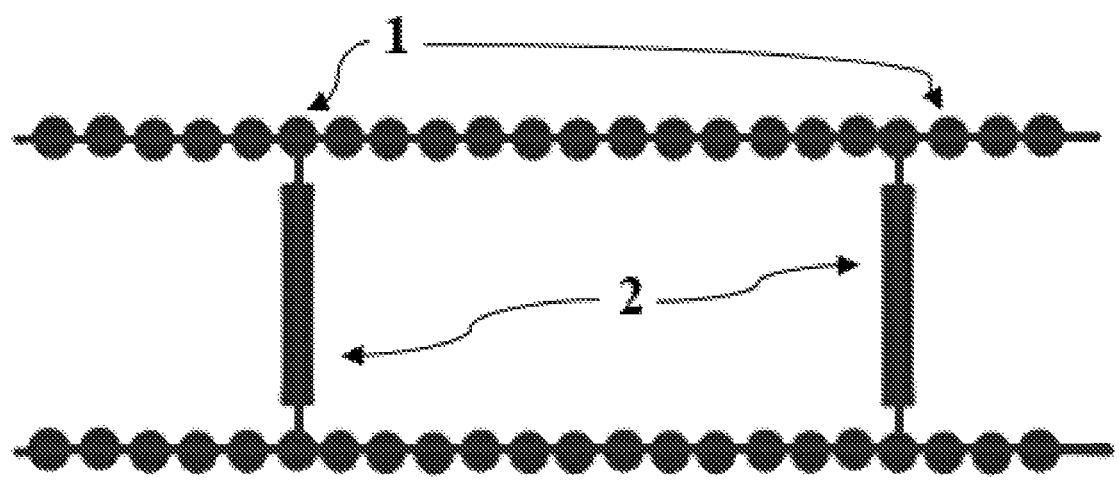
FIG. 1 depicts a conceptualized network structure formed by methacrylate-containing compositions according to embodiments of the present invention.

A first aspect of the invention is a radiation curable composition for additive fabrication comprising:
a. from 40 to 95 wt. %, based on the total weight of the composition, of a urethane methacrylate oligomer having at least one polymerizable group,
  Wherein the urethane methacrylate oligomer is the reaction product of a diisocyanate, a polyol, and a hydroxy-functional methacrylate, and
  wherein the urethane methacrylate oligomer has a number average molecular weight (Mn) from 750 to 4000 g/mol;
b. an effective quantity of a monofunctional reactive diluent monomer;
c. from 2 to 20 wt. %, or from 5 to 20 wt. %, or from 8 to 20 wt. %, or from 5 to 15 wt. %, or from 5 to 12 wt. %, based on the total weight of the composition, of a methacrylate-functional network building agent (NBA) comprising a number average of greater than 1.5 polymerizable groups;
  wherein at least one of the polymerizable groups of the methacrylate-functional NBA is able to (co)polymerize with the at least one polymerizable group of the urethane methacrylate oligomer, and
  wherein the methacrylate-functional NBA possesses an Mn value that is less than the Mn value of the urethane methacrylate oligomer and higher than the Mn of the reactive diluent monomer;
d. optionally, one or more photoinitiators; and
e. optionally, one or more additives;
wherein Mn is measured by size exclusion chromatography (SEC) calibrated with a polystyrene standard in tetrahydrofuran.

Compositions according to the first aspect of the present invention possess at least an oligomer component (and specifically a urethane methacrylate oligomer), a reactive diluent monomer, a methacrylate-functional network building agent, optionally, one or more photoinitiators, and optionally, one or more additives, each of which is described in turn below.

Oligomers

Compositions according to the present invention include one or more oligomers. An oligomer is used herein to mean a molecule of intermediate relative molecular mass, the structure of which comprises a plurality of units derived, actually or conceptually, from molecules of lower relative molecular mass. As used herein, a component is considered an oligomer if it further possesses a number average molecular weight (Mn) from about 600 g/mol to about 35,000 g/mol, as measured by size exclusion chromatography (SEC) calibrated with a polystyrene standard in tetrahydrofuran. As used herein, unless otherwise specified, wherever reference is made to the term "number average molecular weight" or "Mn," it is implied that the method for determining such value is via SEC calibrated with a polystyrene standard in tetrahydrofuran.

Compositions of the present invention include one or more urethane oligomers; i.e. an oligomer containing a urethane linkage or an oligomer that is contains the reaction product of a component possessing a urethane group. The urethane oligomer should be functionalized in the sense that it possesses at least one polymerizable group. Compositions of the present invention include one or more urethane methacrylate oligomers, which are urethane oligomers with a methacrylate functional group. The urethane methacrylate oligomers according to the present invention are the reaction product of one or more polyol compounds, isocyanate compounds, and methacrylate compounds. Typically, the oligomer possesses a backbone or central structure defined by the polyol or polyols selected, to which one or more (di)isocyanate compounds are reacted and bonded. Such oligomers may be terminated at one or more ends by hydroxy-functional methacrylate compounds.

Examples of suitable polyols compounds are polyether polyols, polyester polyols, polycarbonate polyols, polycaprolactone polyols, acrylic polyols, and other polyols. In a preferred embodiment, the polyols selected may comprise polyethylene glycol, polypropylene glycol, poly THF, polybutylene oxide, polyethylene co-propylene oxide, or polyethyleneoxide-block-propylene oxide, or mixtures thereof.

These polyols may be used either individually or in combinations of two or more. There are no specific limitations to the manner of polymerization of the structural units in these polyols. Each of random polymerization, block polymerization, or graft polymerization is acceptable.

Given as further examples of the polyether polyols are polyethylene glycol, polypropylene glycol, polypropylene glycol-ethylene glycol copolymer, polytetramethylene glycol, polyhexamethylene glycol, polyheptamethylene glycol, polydecamethylene glycol, and polyether diols obtained by ring-opening copolymerization of two or more ion-polymerizable cyclic compounds. Here, given as examples of the ion-polymerizable cyclic compounds are cyclic ethers such as ethylene oxide, isobutene oxide, tetrahydrofuran, 2-methyltetrahydrofuran, 3-methyltetrahydrofuran, dioxane, trioxane, tetraoxane, cyclohexene oxide, styrene oxide, epichlorohydrin, isoprene monoxide, vinyl oxetane, vinyl tetrahydrofuran, vinyl cyclohexene oxide, phenyl glycidyl ether, butyl glycidyl ether, and glycidyl benzoate. Specific examples of combinations of two or more ion-polymerizable cyclic compounds include combinations for producing a binary copolymer such as tetrahydrofuran and 2-methyltetrahydrofuran, tetrahydrofuran and 3-methyltetrahydrofuran, and tetrahydrofuran and ethylene oxide; and combinations for producing a ternary copolymer such as a combination of tetrahydrofuran, 2-methyltetrahydrofuran, and ethylene oxide, a combination of tetrahydrofuran, butene-1-oxide, and ethylene oxide, and the like. The ring-opening copolymers of these ion-polymerizable cyclic compounds may be either random copolymers or block copolymers.

Included in these polyether polyols are products commercially available under the trademarks, for example, PTMG1000, PTMG2000 (manufactured by Mitsubishi Chemical Corp.), PEG #1000 (manufactured by Nippon Oil and Fats Co., Ltd.), PTG650 (SN), PTG1000 (SN), PTG2000 (SN), PTG3000, PTGL1000, PTGL2000 (manufactured by Hodogaya Chemical Co., Ltd.), PEG200, PEG400, PEG600, PEG1000, PEG1500, PEG2000, PEG4000, PI G6000 (manufactured by Daiichi Kogyo Seiyaku Co., Ltd.) and Pluronics (by BASF).

Polyester diols obtained by reacting a polyhydric alcohol and a polybasic acid are given as examples of the polyester polyols. As examples of the polyhydric alcohol, ethylene glycol, polyethylene glycol, tetramethylene glycol, polytetramethylene glycol, 1,6-hexanediol, 3-methyl-1,5-pentanediol, 1,9-nonanediol, 2-methyl-1,8-octanediol, and the like can be given. As examples of the polybasic acid, phthalic acid, dimer acid, isophthalic acid, terephthalic acid, maleic acid, fumaric acid, adipic acid, sebasic acid, and the like can be given.

These polyester polyol compounds are commercially available under the trademarks such as MPD/IPA500, MPD/IPA1000, MPD/IPA2000, MPD/TPA500, MPD/TPA1000, MPD/TPA2000, Kurapol A-1010, A-2010, PNA-2000, PNOA-1010, and PNOA-2010 (manufactured by Kuraray Co., Ltd.).

As examples of the polycarbonate polyols, polycarbonate of polytetrahydrofuran, poly(hexanediol carbonate), poly(nonanediol carbonate), poly(3-methyl-1,5-pentamethylene carbonate), and the like can be given.

As commercially available products of these polycarbonate polyols, DN-980, DN-981 (manufactured by Nippon Polyurethane Industry Co., Ltd.), Priplast 3196, 3190, 2033 (manufactured by Uniehema), PNOC-2000, PNOC-1000 (manufactured by Kuraray Co., Ltd.), PLACCEL CD220, CD210, CD208, CD205 (manufactured by Daicel Chemical Industries, Ltd.), PC-THF-CD (manufactured by BASF), and the like can be given.

In an embodiment, the polyol component includes one or more polycaprolactone diols. Polycaprolactone diols are obtained by reacting e-caprolactone and a diol compound are given as examples of the polycaprolactone polyols having a melting point of 0° C. or higher. Here, given as examples of the diol compound are ethylene glycol, polyethylene glycol, polypropylene glycol, polypropylene glycol, tetramethylene glycol, polytetramethylene glycol, 1,2-polybutylene glycol, 1,6-hexanediol, neopentyl glycol, 1,4-cyclohexanedimethanol, 1,4-butanediol, and the like. In an embodiment, the polycaprolactone diol further comprises a primary hydroxyl group.

Commercially available products of these polycaprolactone polyols include PLACCEL 240, 230, 230ST, 220, 220ST, 220NP1, 212, 210, 220N, 21 ON, L230AL, L220AL, L220PL, L220PM, L212AL (all manufactured by Daicel Chemical Industries, Ltd.), Rauccarb 107 (by Enichem), and the like.

As examples of other polyols ethylene glycol, 1,4-butanediol, 1,5-pentanediol, 1,6-hexanediol, polyoxyethylene bisphenol A ether, polyoxypropylene bisphenol A ether, polyoxyethylene bisphenol F ether, polyoxypropylene bisphenol F ether, and the like can be given.

As these other polyols, those having an alkylene oxide structure in the molecule, in particular polyether polyols, are preferred. In an embodiment, polyols containing polytetramethylene glycol and copolymer glycols of butylene oxide and ethylene oxide are particularly preferred.

In an embodiment, the urethane methacrylate comprises the reaction product of a polyol having a theoretical molecular weight from 200 to 6000 g/mol, or from 150 to 1000 g/mol, or from about 150 to about 500, or from about 150 to about 300, or from about 150 to about 250 g/mol.

The urethane methacrylate oligomer is also the reaction product one or more isocyanate compounds. In an embodiment, the isocyanate is a diisocyanate or polyisocyanate. In a preferred embodiment, the isocyanates selected are aliphatic compounds. Any suitable isocyanate compound may be selected, including isophorone diisocyanate, hexane diisocyanate, 2,2,4-trimethyl hexane diisocyanate, 2,4,4-trimethylhexane diisocyanate, pentane diisocyanate or 4,4-methylene bis(cyclohexyl isocyanate), or mixtures thereof.

Given as examples of the polyisocyanate used for the oligomer are 2,4-tolylene diisocyanate, 2,6-tolylene diisocyanate, 1,3-xylylene diisocyanate, 1,4-xylylene diisocyanate, 1,5-naphthalene diisocyanate, m-phenylene diisocyanate, p-phenylene diisocyanate, 3,3'-dimethyl-4,4'-diphenylmethane diisocyanate, 4,4'-diphenylmethane diisocyanate, 3,3'-dimethylphenylene diisocyanate, 4,4'-biphenylene diisocyanate, 1,6-hexane diisocyanate, isophorone diisocyanate, methylenebis(4-cyclohexylisocyanate), 2,2,4-trimethylhexamethylene diisocyanate, bis(2-isocyanato-ethyl)fumarate, 6-isopropyl-1,3-phenyl diisocyanate, 4-diphenylpropane diisocyanate, hydrogenated diphenylmethane diisocyanate, hydrogenated xylylene diisocyanate, tetramethyl xylylene diisocyanate, lysine isocyanate, and the like. These polyisocyanate compounds may be used either individually or in combinations of two or more.

The urethane methacrylate oligomer also comprises the reaction product of one or more methacrylate compounds. In a preferred embodiment, the methacrylate compounds used are hydroxy-functional. In an embodiment, the urethane methacrylate oligomer consists only of functional groups which are methacrylate-based compounds. Examples of potential methacrylate compounds suitable for use in the oligomers of the present invention include, but are not limited to, hydroxy ethyl methacrylate, 1-hydroxypropyl methacrylate, 2-hydroxypropyl methacrylate, 1-hydroxybutyl methacrylate, diethylene glycol methacrylate, dipropylene glycol methacrylate, or caprolactone 2-(methacryloyloxy)ethyl ester, or mixtures thereof.

Further examples of the hydroxyl group-containing methacrylate used in the oligomer, include, methacrylates derived from methacrylic acid and epoxy and methacrylates comprising alkylene oxides, more in particular, 2-hydroxy ethyl methacrylate, 2-hydroxypropylacrylate and 2-hydroxy-3-oxyphenylmethacrylate. Methacrylate functional groups are preferred.

The oligomer synthesis is conducted such that the methacrylate reactants are controlled to provide the desired number of polymerizable groups on the entire urethane methacrylate oligomer. In an embodiment, the urethane methacrylate oligomer comprises number average from 0.9 to 2.1 polymerizable groups, or from 0.9 to 1.1 polymerizable groups, or from 0.9 to 3.1 polymerizable groups, or from 2.9 to 3.1 polymerizable groups, or from 1.9 to 2.1 polymerizable groups. In a preferred embodiment, the polymerizable groups are methacrylate groups. In an embodiment, the polymerizable groups consist of methacrylate groups.

In an embodiment, the ratio of polyol, isocyanate, and hydroxyl group-containing methacrylate used for preparing the urethane methacrylate is determined so that about 1.1 to about 3 equivalents of an isocyanate group included in the isocyanate and about 0.1 to about 1.5 equivalents of a hydroxyl group included in the hydroxyl group-containing methacrylate are used for one equivalent of the hydroxyl group included in the polyol.

In the reaction of these three components, a urethanization catalyst such as copper naphthenate, cobalt naphthenate, zinc naphthenate, di-n-butyl tin dilaurate, triethylamine, and triethylenediamine-2-methyltriethyleneamine, or the like may be used. Such catalysts are typically employed in an amount from about 0.01 to about 1 wt. % of the total amount of the reactant. The reaction is carried out at a temperature from about 10 to about 90° C., and preferably from about 30 to about 80° C.

The urethane methacrylate oligomers according to the present invention are selected so as to impart desirable mechanical properties, such as improved toughness, into the three-dimensional objects cured therefrom. It is believed, without wishing to be bound by any theory, that the urethane methacrylate oligomer, particularly if used in higher quantities, has the largest effect on the mechanical properties of the cured network. In order to accomplish this, it is often desirable to select urethane methacrylate oligomers possessing structures and molecular weights that do not yield optimal curing performance or processability in additive fabrication processes. Specific oligomer structures may be designed and utilized depending on the needs of the particular end-use application of the three-dimensional printed parts cured from the composition to be employed.

In a preferred embodiment, therefore, the urethane methacrylate oligomers may possess a number average molecular weight from 750 to 10000 g/mol, or from 750 to 600 g/mol. Oligomers with Mn values below 750 g/mol may not enable sufficiently long crosslinking chains to be established, thereby limiting the physical performance and toughness of the three-dimensional parts cured therefrom. Oligomers possessing Mn values beyond 6000 g/mol, or especially beyond 10000 g/mol may inhibit the cure speed and processability of the radiation curable composition into Which they are incorporated, and the resulting viscosity of the entire formulation may rise to levels that render the composition ill-suited for use in most additive fabrication build processes. In another embodiment, the urethane methacrylate oligomer possesses an Mn value from 750 to 10000 g/mol, or 1000 to 7000 g/mol, or 1000 to 6000 g/mol, or 1000 to 5000 g/mol, or 1000 to 4000 g/mol, or 750 to 3000 g/mol, or 2000 to 8000 g/mol, or 2000 to 7000 g/mol, or 2000 to 6000 g/mol, or 2000 to 5000 g/mol, or 2000 to 4000 g/mol, or 3000 to 8000 g/mol, or 3000 to 7000 g/mol, or 3000 to 6000 g/mol, or 3000 to 5000 g/mol, or 4000 to 8000 g/mol, or 4000 to 7000 g/mol, or 750 to 6000 g/mol.

Inventors have presently surprisingly discovered that, when incorporated into compositions with the other components as described elsewhere herein, it is possible to formulate radiation curable compositions that are processable in additive fabrication applications that are urethane methacrylate oligomer centric, that is, such compositions comprise by weight a larger amount of urethane methacrylate oligomer than any other compositional constituent. Inventors have discovered that by formulating in such an oligomer-centric fashion, it is possible to create compositions which are capable of yielding cured articles possessing excellent physical properties, including toughness, elongation, and heat resistance, to name a few. Furthermore, it is presently noted that the oligomer contributes significantly to the overall properties of the parts cured therefrom, especially when used in large amounts, it will be possible to tailor the composition to the needs of the particular end-use application by tweaking only the oligomer design without significantly sacrificing other aspects of the formulation (such as cure speed and processability).

Therefore, in an embodiment, the urethane methacrylate oligomer is present by weight, relative to the entire composition, from 40 to 95 wt. %, or from 40 to 90 wt. %, or from 40 to 80 wt. %, or from 40 to 75 wt. %, or from 40 to 65 wt. %, or from 50 to 95 wt. %, or from 55 to 95 wt. %, or from 60 to 95 wt. %, or from 65 to 95 wt. %, or from 70 to 95 wt. %, or from 75 to 95 wt. %, or from 80 to 95 wt. %, or from 50 to 90 wt. %, or from 60 to 90 wt. %, or from 60 to 90 wt. %, or from 80 to 90 wt. %, or from 60 to 85 wt %, or from 65 to 85 wt. %, or from 70 to 85 wt. %.

Reactive Diluent Monomers

Compositions according to the first aspect of the present invention contain one or more reactive diluent monomers. As used herein, "reactive" means the ability to form a chemical reaction, preferably a polymerization reaction, with another molecule. As such, a reactive compound will be said to possess at least one reactive, or functional, group. It is preferred that such reactive or functional group is a polymerizable group. A monomer, meanwhile, is used herein to mean a molecule of low relative molecular mass, the structure of which can undergo polymerization thereby contributing constitutional units to the essential structure of a macromolecule. As used herein, a component is considered a monomer if it further possesses an Mn value of less than about 750 g/mol. In a preferred embodiment, however, the reactive diluent monomer component consists of one or more reactive diluent monomers having an Mn from about 100 g/mol (the approximate theoretical molar mass of methyl methacrylate) to 600 g/mol, or from 100 g/mol to 350 g/mol.

Reactive diluent monomers are typically incorporated into compositions for additive fabrication because they reduce the viscosity of the overall formulation to a range that is suitable for use in additive fabrication processes, such as jetting or stereolithography. Their incorporation may be particularly useful to achieve processability where higher molecular weight urethane methacrylate oligomers are also incorporated into the formulation.

Reactive diluent monomers include lower molecular weight monomers containing one double bond. In a preferred embodiment, the reactive diluent monomer is monofunctional, or comprises an average from 0.9 to 1.1 polymerizable groups. The polymerizable groups are preferably of methacrylate functionality. In a preferred embodiment, each reactive diluent monomer in the composition is methacrylate-functional.

Examples of lower molecular weight monomers containing one double bond include alkyl or hydroxyalkyl methacrylates, for example methyl, ethyl, butyl, 2-ethylhexyl and 2-hydroxyethyl methacrylate, isobornyl methacrylate, and methyl and ethyl methacrylate. Further examples of these monomers are acrylonitrile, acrylamide, methacrylamide, N-substituted methacrylamides, vinyl esters such as vinyl acetate, styrene, alkylstyrenes, halostyrenes, N-vinylpyrrolidone, N-vinyl caprolactam, vinyl chloride and vinylidene chloride. Examples of monomers containing more than one double bond are ethylene glycol dimethacrylate, propylene glycol dimethacrylate, neopentyl glycol dimethacrylate, hexamethylene glycol dimethacrylate, bisphenol A dimethacrylate, 4,4'-bis(2-acryloyloxyethoxy)diphenylpropane, trimethylolpropane trimethacrylate, pentaerythritol trimethacrylate and tetramethacrylate, vinyl methacrylate, divinyl benzene, divinyl succinate, diallyl phthalate, triallyl phosphate, triallyl isocyanurate or tris(2-acryloylethyl)isocyanurate.

In an embodiment the reactive diluent monomer comprises a monofunctional urethane methacrylate compound. In another embodiment, the reactive diluent monomer comprises non-urethane methacrylate compounds, such as isopropylideneglycerol methacrylate (IPGMA), (hydroxyethyl) methacrylate (HEMA), 2-hydroxypropyl methacrylate (HPMA), benzyl methacrylate (BMA), cyclohexyl methacrylate, isobornyl methacrylate, or 4-tbutylcyclohexyl methacrylate, or mixtures thereof.

One or more of the aforementioned reactive diluent monomers can be employed in compositions according to the present invention in any suitable amount in order to tune the viscosity of the formulation with which they are associated to be suitable for the additive fabrication process to be used therewith according to methods well-known in the art to which this invention applies. Such reactive diluent monomers may be chosen singly or in combination of one or more of the types enumerated herein. In an embodiment, the reactive diluent monomer component is present in an amount, relative to the entire weight of the entire composition, from about 1 wt. % to about 50 wt. %, or from about 3 wt. % to about 50 wt. %, or from about 5 wt. % to about 50 wt. %, or from about 5 wt. % to about 40 wt. %, or from about 5 wt. % to about 30 wt. %., or from about 5 wt. % to about 20 wt. %, or from about 10 wt. % to about 50 wt %, or from about 10 wt,% to about 30 wt. %, or from about 10 wt. % to about 25 wt. %.

Network Building Agents

Compositions according to the first aspect of the present invention further comprise one or more network building agents (NBA). As used herein, network building agents includes any monomer(s) (including molecules comprising a plurality of structural units derived, actually or conceptually, from molecules of lower relative molecular mass, so long as the molecule itself possesses a number average molecular weight of less than 600 g/mol) that is (co)polymerizable with the oligomer component described above, and possesses an average functionality of at least 1.5 polymerizable units or groups per molecule. Without wishing to be bound by any theory, Inventors believe that a certain quantity of NBAs are required to be incorporated into the composition in order to facilitate the creation of a rapidly polymerizing "scaffolding" structure which will impart sufficient green strength in the article to be formed, such that the cured part does not deform or collapse upon itself during the additive fabrication build process. With such NBA-induced scaffolding preserving the integrity of the shape of the desired object to be formed, the slower-reacting but toughness-enhancing urethane methacrylate oligomers are provided the opportunity to react and crosslink into the overall network structure, imparting superior material performance into the cured object created therefrom.

Further, as the NBA can possess high Tg values, it is possible to utilize such components to formulate for the creation of cured networks simultaneously possessing superior heat resistance and toughness. Such a combination of properties is particularly desired in thermoset materials tier additive fabrication, wherein it is highly desired to produce articles which approach the material performance of engineering thermoplastics, such as polycarbonate or ABS. A conceptual network structure showing the interrelation of such network building agents with the accompanying urethane methacrylate oligomer component is shown in FIG. 1. In FIG. 1, the network building agents 1 form the scaffolding structure. Such NBAs 1 are high Tg polymerizable units, which are interspersed by the relatively larger molecular weight crosslinking urethane methacrylate oligomers 2.

In order to be considered a network building agent for purposes of the present invention, the NBA possesses a number average molecular weight that is less than the number average molecular weight of the urethane methacrylate oligomer, but more than the reactive diluent monomer used in connection therewith. In an embodiment, the methacrylate-functional network building agent (NBA) comprises a possesses a number average molecular weight from 150 to 750 g/mol, or from 200 to 500 g/mol.

In a preferred embodiment, the NBA comprises a difunctional compound, or one with about 2 (an average of 1.9 to 2.1) functional groups. In an embodiment, the NBA comprises a number average from 1.5 to 3.1 polymerizable groups, or from 1.9 to 3.1 polymerizable groups, or from 1.9 to 2.1 polymerizable groups. In a preferred embodiment, the crosslinker is multifunctional. As used herein, "multifunctional" means the pertinent component possesses an average of at least 1.9 functional groups per molecule.

Inventors have further discovered that several additional factors contribute to the efficacy of the NBA present in compositions according to the current invention. For one, the number of strong hydrogen-bonding donor sites present in the NBA molecule is believed to have an impact upon such NBA's ability to stimulate rapid curing in an oxygen-rich 31) printing build process. Such strong hydrogen-bonding donor sites must exist separate from those present in the polymerizable group itself, and can include, without limitation, an amide, carbamide, ester, hydroxyl, urea, or urethane group. Specifically, urethane, urea, and amide groups are preferred to improve printability under oxygen-rich conditions. Of those, urethane groups are particularly preferred.

Another characteristic believed to contribute to improved printability is the degree of aromaticity of the NBA selected. All else being equal, Inventors believe that a larger number of aromatic groups will contribute to improved 3D printability in oxygen-rich media. To be effective, an NBA need not possess both aromatic groups and strong hydrogen bond donor sites, although they may do so.

Some non-limiting examples of NBAs may include ethylene glycol dimethacrylate, diethylene glycol dimethacrylate, triethylene glycol dimethacrylate, tetra ethylene glycol dimethacrylate, ethoxylated hexane diol dimethacrylate, trimethylolpropane ethoxylate, trimethylolpropane dimethacrylate, trimethylolpropane trimethacrylate, methyl ether dimethacrylate, neopentyl glycol dimethacrylate, 1,3-butanediol dimethacrylate, glycerol-1,3-diglycerolate dimethacrylate, 1,6-hexanediyl bis[oxy-2-hydroxy-3,1-propanediyl]bis methacrylate, pentaerythritol trimethacrylate, or ethoxylated pentaerythritol trimethacrylate, 1,4 butanediol dimethacrylate or 1,6 hexane diol dimethacrylate, or any combinations thereof.

Examples of additional potential NBAs containing more than one double bond are ethylene glycol dimethacrylate, propylene glycol dimethacrylate, neopentyl glycol dimethacrylate, hexamethylene glycol dimethacrylate; bisphenol. A dimethacrylate, 4,4'-bis(2-acryloyloxyethoxy)diphenylpropane, trimethylolpropane trimethacrylate, pentaerythritol trimethacrylate and tetramethacrylate, vinyl methacrylate, divinyl benzene, divinyl succinate, diallyl phthalate, triallyl phosphate, triallyl isocyanurate or tris(2-acryloylethyl)isocyanurate.

Of course, multiple NBAs, including the specific types herein described, may be used singly or in any combination. Also, the NBAs should be selected so that at least one possesses a functional group which is (co)polymerizable with the functional group of the urethane methacrylate oligomer. In an embodiment, the NBA possesses methacrylate functional groups. In an embodiment, the NBA consists of methacrylate functional groups.

In a preferred embodiment, the NBA comprises a methacrylate-functional aliphatic urethane-containing compound. The inclusion of such an NBA ensures optimum overall network formation and compatibility with the urethane methacrylate oligomers described elsewhere herein. In an embodiment, the NBA consists of such methacrylate-functional aliphatic urethane containing compounds. Methacrylate-functional urethane containing compounds involve the reaction product of an isocyanate and a methacrylate.

In an embodiment, the urethane methacrylate network building agent comprises bisphenol A glycidyl methacrylate, triethylene glycol dimethacrylate, trimethyl hexamethylene diisocyanate di(hydroxyethyl)methacrylate, or a methacrylate-terminated isocyanate compound.

A variety of any suitable methacrylate-terminated isocyanate comprising a methacrylate-terminated moiety and an isocyanate moiety may be used as the NBA. Usable examples for the methacrylate-terminated moiety include (hydroxyethyl)methacrylate or 2-hydroxypropyl methacrylate, and examples of the isocyanate moiety include hexamethylene diisocyanate, isophorone diisocyanate, tolulenediisocyanate, or TMXDI. Accordingly, in an embodiment, the urethane methacrylate NBA comprises HEMA-HMDI-HEMA, HPMA-IPDI-HPMA HPMA-IPDI-HPMA HPMA-TDI-HPMA HPMA-HDI-HPMA HPMA-HMDI-HPMA, or HPMA-TMXDI-HPMA.

Urethane methacrylate compounds further utilize a catalyst in the synthesis process. The catalysts described elsewhere herein in the formation of the urethane methacrylate oligomers may also be suitable for the formation of the NBA as well. In an embodiment, the methacrylate-functional network building agent (NBA) is substantially tin-free, or wherein the methacrylate-functional NBA comprises less than 5 wt. %, or less than 1 wt. %, or less than 0.1 wt. %, or less than 0.01 wt. % of elemental tin or a tin-containing compound.

The aforementioned network building agents may be used singly or in combinations of two or more. The NBAs may be employed in any suitable amount, but are ideally present in an amount by weight, relative to the entire composition, in an amount that is substantially lower than the urethane methacrylate oligomer. This is because although a high NBA concentration will facilitate a rapidly curing material, it will likely render such material brittle or otherwise lacking in toughness and material performance. Therefore, in a preferred embodiment, the NBA is present in an amount, by weight relative to the entire composition, from 2 wt. % to 20 wt. %, or from 8 wt. % to 20 wt %.

Inventors have presently discovered that, in order to provide radiation curable compositions which are suitably fast-curing for additive fabrication processes, the required compositional concentration of NBA should vary according to several factors. First, inventors have discovered that as the oxygen content of the medium in which the additive fabrication process is occurring (and more particularly the photopolymerization portion of the additive fabrication process) increases logarithmically, the required NBA concentration of the radiation curable composition concomitantly increases approximately linearly. Therefore, when used in additive manufacturing processes having a low oxygen ambient environment and; or with relatively reduced light intensity, such as in bottom-up DLP-based systems, Inventors have discovered that lower amounts of the NBA component can be used to similar effect, such as down to 2 wt. %. In more oxygen-rich environments and/or those with higher-power lasers, such as SLA-based systems, however, more of the NBA is required, such as about 8 wt. % or more.

Furthermore, inventors have discovered that the relative required concentration of NBA decreases with increasing: (a) average functionality or (b) overall stiffness of the urethane methacrylate oligomer employed. Additionally, the relative required concentration of NBA increases with increasing molecular mass of either (a) the urethane methacrylate oligomer employed, or even (b) the NBA itself. Therefore, in another embodiment, the NBA is present in an amount by weight, relative to the entire composition, from 1 to 20 wt. %, or from 2 to 20 wt. %, or from 5 to 20 wt. %, or from 8 to 20 wt. %, or from 5 to 15 wt. %, or from 10 to 20 wt. %, or from 5 to 12 wt. %.

Photoinitiators

Compositions according to the present invention may possess one or more photoinitiators. Photoinitiators tend to initiate, enable, facilitate, or catalyze chemical reactions that result in or improve the rate or amount of photopolymerization in a given composition when it is subjected to appropriate amounts of actinic radiation. A photoinitiator is a compound that undergoes a photoreaction upon absorption of actinic radiation (particularly in the visible and/or UV spectral region), whereupon reactive species are created. These reactive species are capable of catalyzing, initializing, or carrying out chemical reactions that result in significant changes in the physical properties of suitable formulations. Hence, the photoinitiator is a compound that can transform the physical energy of light into suitable chemical energy in the form of reactive intermediates. Common types of photoinitiators include cationic photoinitiators and free-radical photoinitiators.

As used in the compositions of the first aspect of the invention, the photoinitiators serve to initiate polymerization of the urethane methacrylate oligomer, reactive diluent monomer, and/or the network building agents. In an embodiment, photoinitiator initiates polymerization in response to UV light, visible light, or both UV light and visible light. In an embodiment, the photoinitiator initiates polymerization at a wavelength of from 300 to 470 nm, or from 300 to 395 nm, or from 325 to 365 nm, or from 345 to 430 nm.

In a preferred embodiment, the photoinitiators comprise a free-radical photoinitiator. In an embodiment, the free-radical photo-initiator is selected from the group consisting of benzoyl phosphine oxides, aryl ketones, benzophenones, hydroxylated ketones, 1-hydroxyphenyl ketones, ketals, metallocenes, and any combination thereof.

In an embodiment, the free-radical photo-initiator may be 2,4,6-trimethylbenzoyl diphenylphosphine oxide, 2,4,6-trimethylbenzoyl phenyl, ethoxy phosphine oxide, bis(2,4,6-trimethylbenzoyl)-phenylphosphineoxide, 2-methyl-1-[4-(methylthio)phenyl]-2-morpholinopropanone-1,2-benzyl-2-(dimethylamino)-1-[4-(4-morpholinyl) phenyl]-1-butanone, 2-dimethylamino-2-(4-methyl-benzyl)-1-(4-morpholin-4-yl-phenyl)-butan-1-one, 4-benzoyl-4'-methyl diphenyl sulphide, 4,4'-bis(diethylamino) benzophenone, and 4,4'-bis(N, N'-dimethylamino) benzophenone (Michler's ketone), benzophenone, 4-methyl benzophenone, 2,4,6-trimethyl benzophenone, dimethoxybenzophenone, 1-hydroxycyclohexyl phenyl ketone, phenyl (1-hydroxyisopropyl)ketone, 2-hydroxy-1-[4-(2-hydroxyethoxy) phenyl]-2-methyl-1-propanone, 4-isopropylphenyl(1-hydroxyisopropyl)ketone, oligo-[2-hydroxy-2-methyl-1-[4-(1-methylvinyl)phenyl] propanone], camphorquinone, 4,4'-bis(diethylamino) benzophenone, benzil dimethyl ketal, or bis(eta 5-2-4-cyclopentadien-1-yl) bis[2,6-difluoro-3-(1H-pyrrol-1-yl) phenyl] titanium, and any combination thereof.

Further free-radical photo-initiators include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl) phenyl]-1-butanone (Irgacure 369 from Ciba), 2-dimethylamino-2-(4-methylbenzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis(diethylamino) benzophenone (Chivacure EMK from Chitec), 4,4'-bis(N,N'-dimethylamino) benzophenone (Michler's ketone), camphorquinone, 4,4'-bis(diethylamino) benzophenone (Chivacure EMK from Chitec), 4,4'-bis(N,N'-dimethylamino) benzophenone (Michler's ketone), bis(2,4,6-trimethylbenzoyl)-phenylphosphineoxide (Irgacure 819 or BAPO from Ciba), and metallocenes such as bis (eta 5-2-4-cyclopentadien-1-yl) bis [2,6-difluoro-3-(1H-pyrrol-1-yl) phenyl] titanium (Irgacure 784 from Ciba), or a mixture thereof.

If used, in an embodiment, the one or more photoinitiators are present in an amount of at least 0.01 wt. %, at least 0.05 wt. %, at least 0.1 wt. %, at least 0.2 wt. %, at least 0.3 wt. %, at least 0.4 wt. %, at least 0.5 wt. %, at least 1.0 wt. %, at least 1.5 wt. %, at least 2 wt. %, or at least 2.5 wt. %, based on the total weight of the composition. In an embodiment, the one or more photoinitiators are present in an amount of at most 10 wt. %, at most 8 wt. %, at most 7 wt. %, at most 6 wt. %, at most 5 wt. %, or at most 4 wt. %, based on the total weight of the composition.

In an embodiment, the one or more photoinitiators are present in an amount of at least 0.01 wt. %, at least 0.05 wt. %, at least 0.1 wt. %, at least 0.2 wt. %, at least 0.3 wt. %, at least 0.4 wt. %, at least 0.5 wt. %, at least 1.0 wt. %, at least 1.5 wt. %, at least 2 wt. %, or at least 2.5 wt. %, based on the total weight of the composition excluding any solvent. In an embodiment, the one or more photoinitiators are present in an amount of at most 10 wt. %, at most 8 wt. %, at most 7 wt. %, at most 6 wt. %, at most 5 wt. %, or at most 4 wt. %, based on the total weight of the composition excluding any solvent.

In an embodiment, the one or more photoinitiators are present in an amount of at least 0.01 wt. %, at least 0.05 wt. %, at least 0.1 wt. %, at least 0.2 wt. %, at least 0.3 wt. %, at least 0.4 wt. %, at least 0.5 wt. %, at least 1.0 wt. %, at least 1.5 wt. %, at least 2 wt. %, or at least 2.5 wt. %, based on the total weight of the first network-forming component. In an embodiment, the one or more photoinitiators are present in an amount of at most 10 wt. %, at most 8 wt. %, at most 7 wt. %, at most 6 wt. %, at most 5 wt. %, or at most 4 wt. %, based on the total weight of the radiation curable composition.

Additives

The composition may optionally further include one or more additives. Possible additives include stabilizers, dyes, pigments, antioxidants, wetting agents, photosensitizers, chain transfer agents, leveling agents, defoamers, surfactants and the like.

The radiation curable resin composition for additive fabrication of the invention can further include one or more additives selected from the group consisting of bubble breakers, antioxidants, surfactants, acid scavengers, thickeners, flame retardants, silane coupling agents, ultraviolet absorbers, resin particles, core-shell particle impact modifiers, soluble polymers and block polymers.

Stabilizers are often added to the resin compositions in order to further prevent a viscosity build-up, for instance a viscosity build-up during usage in a solid imaging process. Useful stabilizers include those described in U.S. Pat. No. 5,665,792, the entire disclosure of which is hereby incorporated by reference. In the instant claimed invention, the presence of a stabilizer is optional. In a specific embodiment, the liquid radiation curable resin composition for additive fabrication comprises from 0.1 wt. % to 3% of a stabilizer.

In an embodiment, the composition contains a filler. Examples of fillers include both organic and inorganic particulate fillers. The filler may possess a surface functionality or not, the surface functionality comprising a polymerization group that is capable of (co)polymerization with one or more of the urethane methacrylate oligomer, reactive diluent monomer, or network building agent. The filler may comprise organic or inorganic particles of micron size or less, such as nano-particles. Examples include core-shell particles, inorganic particles, pigments, or plasticizers. In an embodiment, the particulate filler comprises an inorganic filler, such as $SiO_2$, $AlO_2$, $TiO_2$, $ZnO_2$, $SnO_2$, Am—$SnO_2$, $ZrO_2$, Sb—$SnO_2$, $Al_2O_3$, or carbon black. Inorganic fillers, especially silica-based fillers, are described in, i.a, U.S. Pat. No. 9,228,073.

In an embodiment, the particulate filler comprises an organic filler, such as polyurethane particles, polystyrene particles, poly(methyl methacrylate) particles, or polycarbonate particles.

If present, the additives may be included in an amount from 1 to 40 wt. %, relative to the weight of the entire composition. In an embodiment, the composition includes additives further comprising one or more fillers. In an embodiment, the fillers comprise an impact modifier. In an embodiment, the impact modifier comprises core-shell particles.

In an embodiment, the particulate filler is present in the composition in an amount of 1 wt. % or more, 5 wt. % or more, 10 wt. % or more, 15 wt. % or more, 20 wt. % or more, 30 wt. % or more, 40 wt. % or more, or 50 wt. % or more, based on the total weight of the composition. In an embodiment, the particulate filler is present in the composition in an amount of 90 wt. % or less, 80 wt. % or less, 70 wt. % or less, 60 wt. % or less, 50 wt. % or less, 40 wt. % or less, 30 wt. % or less, or 20 wt. % or less, based on the total weight of the composition.

Compositions according to the first aspect of the present invention may be provided as a singular mixture, or the individual components described above herein may be provided as a kit comprising separate containers or enclosures of the compositional elements described. Such kits may be provided in various breakdowns depending on the nature of the additive manufacturing process into which the composition(s) are to be utilized. Some multi-part systems will mix various compositional elements together just prior to jetting, extrusion, or curing. This may be done to enhance stability and to prevent the unwanted reaction of various constituent elements prior to the build process, such as the undesired reaction of a photoinitiator by virtue of ambient or unintended light exposure. In such case, it will be appreciated by those of ordinary skill in the art to which this invention applies that the quantities of materials defined herein will be applicable in the composition at the time such composition is actually cured.

A second aspect of the invention is a method of producing a three-dimensional part via an additive fabrication process, the method comprising:
a. providing a first layer of a radiation curable composition, thereby forming a first surface;
b. optionally, heating at least a portion of the first layer of the radiation curable composition;
c. exposing at least a portion of the first layer of the radiation curable composition imagewise to actinic radiation to form a cured cross-section;
d. providing an additional layer of a radiation curable composition onto at least a portion of the cured cross-section to form an additional layer of the radiation curable composition;
e. exposing at least a portion of the additional layer of the radiation curable composition imagewise to actinic radiation to form an additional cured cross-section;
f. repeating steps (d) and (e) a plurality of times in order to form a three-dimensional object which is the cured product of the radiation curable composition;
wherein
at least one of the first layer or the additional layers of the radiation curable composition is provided in a medium whereby an oxygen content exceeds at least 50% of the ambient oxygen in dry air by volume, and
the radiation curable composition is defined by any of the compositions according to any of the embodiments of the first aspect of the invention.

Layers of radiation curable compositions may be provided in a number of ways, as will be appreciated by those of skill in the art to which this invention applies. The layer may be of any suitable thickness and shape and is dependent on the additive fabrication process utilized. In a stereolithography process, for example, a vat of liquid resin lies in a vat. The first layer is set and controlled by a vertically-moveable platform which raises or lowers (dips) the liquid level in the vat, along with the intensity, orientation, and focus of a laser which cures to a specified depth below the surface of the liquid resin. Such layers will typically be substantially of a uniform thickness in stereo lithography processes. In similar DLP-based processes, instead of a layer determined by a laser depth, the radiation is imparted image-wise in a mask-based pattern, typically by light collimated by a multitude of LED sources. Alternatively, layers may be selectively deposited on a substrate or previous cured layer, as is performed in known jetting processes. The substrate may be a planar build plate or platform, or it may be a powderized bed of particulate resin, for example. Layers may further be provided in a rolling or extrusion process, and may be transported on a moveable foil, film, or carrier, as is described in, e.g., U.S. Pat. No. 8,678,805.

The radiation curable composition provided may be any of those described according to the first aspect of the present invention. However, in a preferred embodiment, the radiation curable composition comprises, relative to the weight of the entire composition, greater than 50 wt. % of one or more urethane methacrylate oligomers, wherein a linear polymer formed by said one or more urethane acrylate oligomers possesses a glass transition temperature (Tg), wherein said Tg is determined by ISO 11357-2. As previously noted, such urethane methacrylate oligomer-centric compositions are believed to facilitate the production of three-dimensional articles with superior performance characteristics, such as toughness, particularly when utilized in additive fabrication processes. The Tg of the linear polymer formed from the methacrylate oligomer may be chosen to be any suitable value, depending upon the desired characteristics of the cured articles for a particular end-use application. In an embodiment, however, the Tg of a linear polymer formed from the urethane methacrylate oligomer is between 30-100° C., or between 40-90° C., or between 40-80° C., or between 40-70° C., or between 50-90° C., or between 50-80° C. In an alternative embodiment, the average Tg of all urethane methacrylate oligomers used in the radiation curable composition is between 30-100° C., or between 40-90° C., or between 40-80° C., or between 40-70° C., or between 50-90° C., or between 50-80° C.

In another example embodiment of the second aspect of the current invention, the radiation curable composition comprises, relative to the weight of the entire composition: from 50-85 wt. % of an aliphatic urethane methacrylate oligomer having a number average molecular weight from 1000 to 10000 g/mol; as measured by size exclusion chromatography using a polystyrene standard in THF; from 2-20 wt. % of a reactive diluent monomer having a number average from 0.9 to 1.1 methacrylate functional groups; from 5-20 wt. % of a difunctional network building agent having a number average molecular weight from 150 to 500 g/mol; as measured by size exclusion chromatography, using a polystyrene standard in THF; from 0.1-5 wt. % of a photoinitiator; and one or more additives; wherein the combined weight of the aliphatic urethane methacrylate oligomer, the reactive diluent monomer, the difunctional network building agent, the photoinitiator, and the additives equals 100 wt. %.

The method according to the second aspect of the present invention optionally includes a heating step. Inventors have surprisingly discovered that the performance characteristics of the three-dimensional articles cured via additive fabrication processes utilizing compositions according to the present invention may be improved depending upon certain temperature controls which are imposed during the build process. Specifically, inventors have surprisingly discovered that, in methacrylate oligomer-centric compositions, the final part properties can be improved if the composition is heated to near—but not above—the glass transition temperature (Tg) of the urethane methacrylate oligomer being employed in the composition. This surprising finding contradicts recent reports on this subject, such as *Hot Lithography v. Room Temperature DLP 3D-printing of a dimethacrylate*, by Bernhard Steyrer et al., Additive Manufacturing 21 (2018) 209-214.

Figure 2:
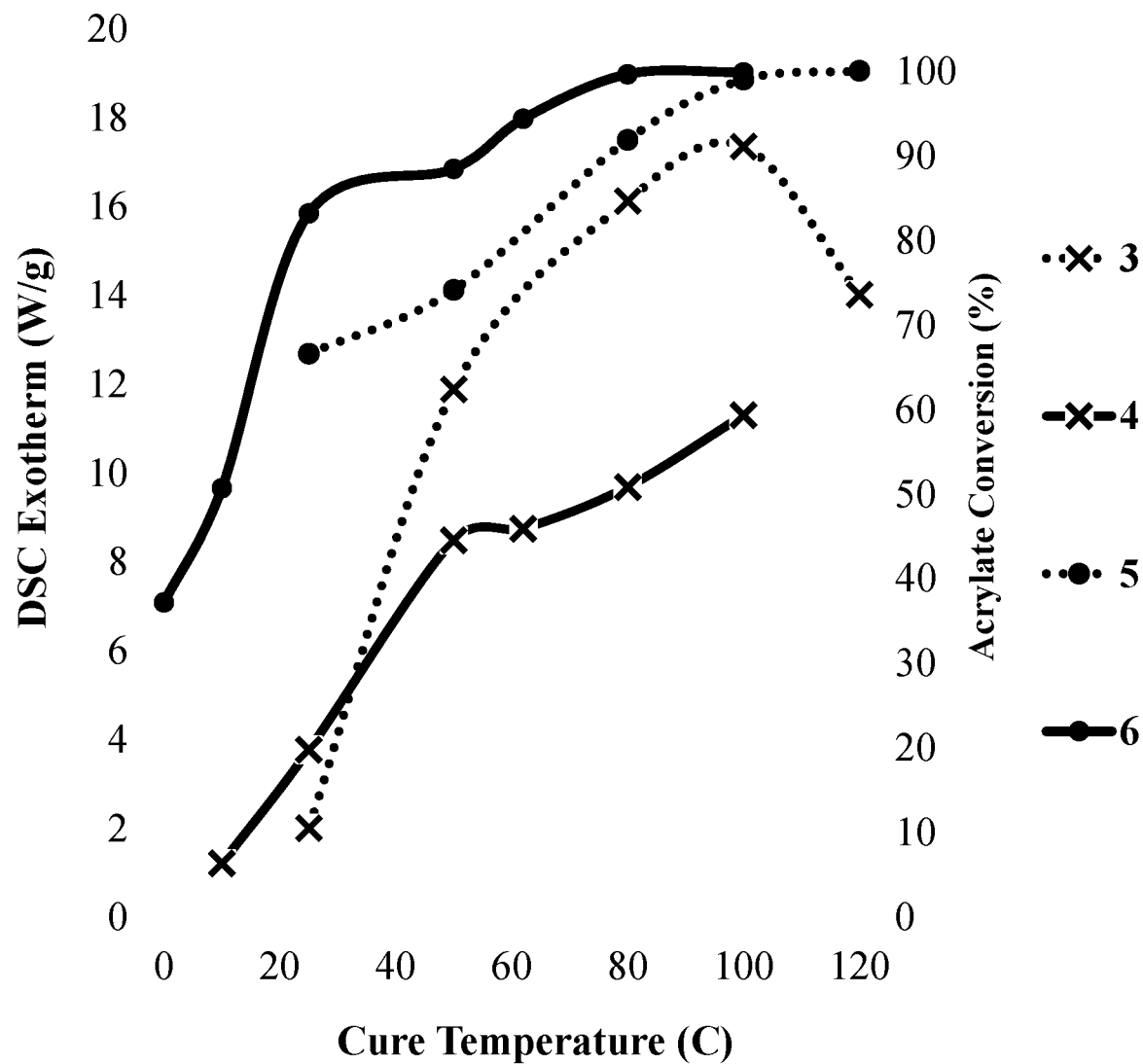
FIG. 2 shows the effect of cure speed and exotherm as a function of the temperature at Which curing occurred for various urethane methacrylate oligomers.

FIG. 2 provides a depiction of this phenomenon. According to FIG. 2, the conversion rates of various oligomers is shown to increase with increasing temperature, up to the Tg of a linear polymer formed for each oligomer. Line 3 depicts the measured exotherm values for oligomer ZC (described in Tables 2A and B elsewhere herein), whereas line 4 depicts the same for oligomer C4 (described in Tables 2A and B elsewhere herein). Lines 3 and 4 are measured by differential scanning calorimetry as a function of cure temperature (in degrees Celsius), and are scaled according to the left-hand axis of the graph in FIG. 2 in units of W/g. Lines 5 and 6 depict conversion values for each of the two oligomers as a function of cure temperature (also in degrees Celsius). Such values are scaled according to the right-hand axis of the graph in FIG. 2 in units of %.

It is believed, without wishing to be bound by any theory, that the increased conversion of the oligomer allows for the inclusion of greater amounts of toughness-enhancing network elements to be imparted into the overall crosslinked structure.

The heating may occur via any known means, as will be appreciated by those having ordinary skill in the art to which this invention applies. The entire ambient atmosphere or room in which the additive fabrication process is being carried out may be heated to the desired temperature, but it is preferable and more economical to heat a more limited volume instead. The build chamber may be therefore heated to the desired temperature, or the composition itself may be heated, whether globally or locally, such that it is controlled to the desired temperature at the point at which the curing occurs.

In an embodiment, the heating step involves the heating of at least a portion of the first layer—particularly the portion to be cured—to a temperature that is equal to or less than the Tg of a linear polymer formed from the urethane methacrylate oligomer. In an embodiment, the heating step involves the heating of the portion of the layer of the composition to be cured to a temperature that is below and within 20° C., or within about 15° C., or within about 10° C., or within about 5° C. of the Tg of a linear polymer formed from at least one of the urethane methacrylate oligomers. In another embodiment, the heating is conducted so as to maintain the temperature to within a desired range below the Tg of the average of a linear network formed from all of the urethane methacrylate oligomers in the composition.

Inventors have additionally discovered that the final network properties of the cured composition are influenced by the content of oxygen in the fluid medium surrounding the radiation curable composition incorporated into the additive fabrication process.

Oxygen inhibition retards propagation of chains by forming stable and unreactive oxygen/peroxide radicals. Inventors have appreciated that adding an agent that can build a network quickly is beneficial to creating an infinite network at relatively low conversion, or relatively low UV exposure time. Inventors have discovered that, rather than being mitigated by oxygen inhibition, the resulting components created via compositions according to the present invention may be enhanced by it. It is believed, without wishing to be bound by any theory, that this is due to: 1) time to vitrification and 2) selective dominance of one type of network in initial curing. Compositions prescribed according to the present invention enable for the creation of faster-building scaffolding network first. This was able to be achieved using all methacrylates by utilizing the unique contributions of chemistry in the oligomer and monomer structures as prescribed herein; i.e. the network behavior relies on an agent at low concentration (NBA) which is able to entrap a network (urethane methacrylate oligomer) and allow it to build effectively regardless of the efficacy of input variables (such as the effect of oxygen inhibition).

In an embodiment, therefore, the oxygen content of the fluid medium in which the curing of the layer occurs is controlled such that oxygen content is enabled into said medium. In an embodiment, the oxygen content approaches ambient atmospheric oxygen levels of dry air (i.e. about 21% by volume). In an embodiment, the oxygen content is controlled such that it is an oxygen-rich medium, meaning it contains at least 50% of the ambient oxygen present in dry air by volume. In an embodiment, the oxygen content equals, by volume, 10% oxygen, or at least 15% oxygen, or from 15-40% oxygen, or from 15-30% oxygen, or from 15-25% oxygen, or from 15-20% oxygen. Any suitable method for determining oxygen contact may be employed, such as by using any commercially available oxygen sensor according to means well-understood in the art to which this invention applies.

The exposing step may occur via any suitable means, including those commonly employed in additive fabrication processes involving the photopolymerization of thermoset materials. Such exposure may be provided via lasers, LED lamps, or any other conventional means.

In the above, "exposing" refers to irradiating with actinic radiation. In an embodiment, the exposing optics utilize one or more LEDs as a light source. In an embodiment, the light source is a laser. In an embodiment, the LED or laser light source is coupled to a DLP or LCD image projection system. In an embodiment wherein the image projection systems includes an LCD display, the light source may be configured to emit actinic radiation exclusively above 400 nm, to minimize the detrimental effect UV wavelengths have upon LCD componentry.

Inventors have discovered, however, that the intensity of the radiation applied at the surface of the resin during exposing and curing also influences the final part properties. Again, it is believed that this relates to the speed and order at which network domains are formed. In an embodiment, therefore, the exposing step involves the application of actinic radiation at an irradiance on a surface of the first layer of the radiation curable composition of less than 200 W/cm$^2$.

The aforementioned steps are repeated a plurality of times as needed to create layers sufficient to establish the final geometry of the article desired to be formed.

A third aspect of the current invention an article cured from the composition according to any of the embodiments according to the first or second aspects of the invention, and/or via the processes described in any of the embodiments according to the second aspect of the invention.

Articles according to the third aspect of the present invention may possess superior mechanical performance, may be tailored for superior performance in a particular area, and/or exhibit enhanced biocompatibility, when compared to other known thermoset compositions for additive fabrication.

Accordingly, in various embodiments, the article may possess one or more of the following mechanical properties: a tensile modulus, when tested according to ASTM D638-14, of greater than 2000 MPa, or greater than 2500 MPa, or greater than 3000 MPa, or about 3210 MPa, or greater than 4000 MPa, or greater than 7000 MPa, or from 2000 MPa to 5000 MPa, or from 2000 MPa to 4000 MPa, or from 2000 MPa to 4500 MPa, or from 3000 MPa to 4000 MPa, or from 3000 MPa to 3500 MPa, or from 800 to 3500 MPa, or from 1000 to 3500 MPa;

a yield stress, when tested according to ASTM D638, of greater than 50 MPa, or greater than 65 MPa, or greater than 80 MPa, or about 83.1 MPa, or from about 65 MPa to about 120 MPa, or from about 65 MPa to about 100 MPa, or from about 70 MPa to about 90 MPa;

an elongation at yield, when tested according to ASTM D638-14, of greater than 3%, or greater than 4%, or about 4.9%, or from about 4% to about 8%, or from about 4% to about 7%;

a flexural strength, when tested according to ASTM D790-17, of greater than 60 MPa, or greater than 70 MPa, or greater than 80 MPa, or greater than 90 MPa, or about 100 MPa, or from about 75 MPa to about 125 MPa, or from about 90 MPa to about 110 MPa;

a heat deflection temperature (HDT), when tested according to ASTM D648 (at 0.46 MPa/66 psi), of greater than about 50 degrees, or greater than about 60 degrees, or greater than about 70 degrees, or about 74 degrees, or from about 60 to about 90 degrees, or from about 65 to about 80 degrees, wherein all degrees are in Celsius; and a water absorption, when tested according to ASTM D570-98, at 25 degrees Celsius, of less than 3%, or less than 2%, or less than 1.5%, or about 1%, or from about 0.5 to about 2%, or from about 0.75 to about 1.5%.

Furthermore, articles according to the third aspect of the current invention preferably possess biocompatible characteristics. Biocompatibility may be determined via a multitude of factors, but one such method is via cytotoxicity testing per ISO10993-5. In an embodiment, articles of the third aspect of the present invention pass cytotoxicity testing per ISO10993-5, such that cell viability is established above 70%, more preferably above 80%, more preferably above 85%, more preferably above 90%, more preferably above 95%, more preferably above 98%, or from 70% to 99%, or from 80% to 99%, or from 90% to 99%, or from 95% to 99.99%.

In an embodiment, the article used to pass said cytotoxicity testing possesses a weight of approximately 2 g and a surface area of approximately 52.8 cm$^2$.

Applications

In accordance with an embodiment of the invention, an article may be formed by polymerizing the composition. In an embodiment, a film formed by polymerizing 90% or more of total the polymerizable groups in the composition has a tensile modulus as measured at 150° C. of from 3, from 5, from 7, from 10, from 15, or from 20 MPa to 50, to 45, or to 40 MPa. In an embodiment, a film formed by polymerizing 90% or more of total the polymerizable groups in the composition has a yield stress at 23° C. of from 50 to 90 MPa, and an elongation at break at 23° C. of greater than 3%, optionally in combination with the above tensile modulus as measured at 150° C. In an embodiment, a film formed by polymerizing 90% or more of the total polymerizable groups in the composition has a tensile modulus at 23° C. of from 2000 to 3500 MPa. Tensile modulus at 150° C. is determined by DMTA in accordance with ASTM D5026. Tensile modulus at 23° C., yield stress at 23° C., and elongation at break at 23° C. are determined according to ISO 37:2011 Rubber, vulcanized or thermoplastic—Determination of tensile stress-strain properties.

The amount of the composition that is polymerized is determined using IR by the following method. Samples are measured on a Perkin Elmer Spectrum One equipped with a Universal ATR Sampling accessory. Peak heights are normalized to the carbonyl peak at 1727 cm$^{-1}$, or another peak that does not change. Conversion is calculated using the following formula: % conversion=$((A_0-A_t)/A_0)*100\%$, wherein Aa is the normalized absorbance prior to cure and $A_t$ is the normalized absorbance during curing. For example, conversion of acrylate bonds may be measured by following the decrease of IR absorbance peak at 810 cm$^{-1}$.

Preferred applications of the composition include additive fabrication processes. Additive fabrication processes, sometimes known as three-dimensional printing, utilize computer-aided design (CAD) data of an object to build three-dimensional objects. These three-dimensional objects may be formed from liquid resins, powders, or other materials. The CAD data is loaded into a computer that controls a machine that forms and binds layers of materials into desired shapes. The desired shapes correspond to portions of a three-dimensional object, such as individual cross-sections of the three-dimensional object. The desired shapes may be formed by selectively dispensing the composition, such as in an inkjet printing system, into the desired shape and then curing or melting the composition if necessary. Another way of forming the desired shapes is by selectively curing or melting the material into the desired shape out of a large bed or vat of material, such as in stereolithography or selective laser sintering.

In an embodiment, an article is formed by forming a layer from a first composition comprising the composition according to the first aspect of the invention and selectively dispensing a second composition comprising one or more first network monomers onto the first composition in accordance with the shape of a portion of a three-dimensional object. The composition may be selectively dispensed by jetting, for example by inkjet.

In an embodiment, a method of forming a three-dimensional object comprises the steps of forming a layer of the composition, curing the layer with radiation to form a desired shape, and repeating the steps of forming and curing a plurality of times to obtain a three-dimensional object. In an embodiment, a method of forming a three-dimensional object comprises the steps of selectively dispensing the composition, curing the composition with radiation to form a desired shape, and repeating the steps of selectively dispensing and curing a plurality of times to obtain a three-dimensional object. In an embodiment, a method of forming a three-dimensional object comprises the steps of forming a layer of the composition, selectively curing the layer with radiation to form a desired shape, and repeating the steps of forming and selectively curing a layer of the composition a plurality of times to obtain a three-dimensional object.

In an embodiment, the viscosity of the composition at 30° C. is 4000 cps or less, 3000 cps, or less, 2000 cps or less, 1500 cps or less, or 1200 cps or less. The viscosity of the composition at 30° C. is typically 300 cps or more.

In an embodiment, the composition is present as a liquid at the time that the polymerization reaction is initiated by the application of light or heat. In an embodiment, the liquid composition possesses a temperature of from 25° or more at the time that polymerization is initiated, such as 30° C. or more, 35° C. or more, 40° C. or more, or 45° C. or more. The temperature is typically 200° C. or less, such as 180° C. or less. In an embodiment, the temperature is 150° C. or less, 100° C. or less, 80° C. or less, or 50° C. or less.

In an embodiment, an article can be formed by first introducing the polymerizable composition into a mold or coating the polymerizable composition on a surface.

In an embodiment, the composition is present as separate parts in a kit of materials. The kit comprises one or more sub-compositions comprising the urethane methacrylate oligomer, reactive diluent monomer, network building agent, photoinitiator, and/or additives. The photoinitiator may be present with either the urethane methacrylate oligomer, the NBA, or as a separate part of the kit.

Some potential applications of articles disclosed herein include as molded articles, dental aligners or other dental appliances, dental drill guides, medical devices, shoe soles, eyeglasses, or any other three-dimensional objects formed by additive fabrication processes.

The following examples further illustrate the invention but, of course, should not be construed as in any way limiting its scope.

EXAMPLES

These examples illustrate embodiments of the radiation curable compositions for additive fabrication of the instant invention. Table 1 describes the various components of the radiation curable compositions for additive fabrication used in the present examples. Tables 2A and 2B, meanwhile, describe the various sub-components used to synthesize the oligomers referred to in Table 1 and used in the present examples. Table 3 lists the compositional make-up of each of the formulations evaluated herein. Finally, Tables 4A, 4B, and 4C describe various performance characteristics of one or more of the formulations used herein.

TABLE 1

| Component | Function in Formula | Chemical Descriptor | Supplier |
|---|---|---|---|
| Oligomer C4 ("C4") | Oligomer | Difunctional urethane methacrylate oligomer; Mn 1367 Da, PDI = 1.42 | DSM |
| Oligomer A1 ("A1") | Oligomer | Difunctional urethane methacrylate oligomer; Mn = 1200 Da, PDI = 1.89 | DSM |
| Oligomer E2 ("E2") | Oligomer | Difunctional urethane methacrylate oligomer; oligomer Mn = 1400.8 Da, PDI = 1.61 | DSM |
| Oligomer U20 ("U20") | Oligomer | Difunctional Urethane acrylate oligomer; Mn = 1695 Da, PDI = 1.3 | DSM |
| Oligomer ZC ("ZC") | Oligomer | Difunctional urethane methacrylate oligomer with terephthalic acid-based backbone, functionality = 1.7, Mn = 1250; ideal structure HEMA-IPDI-(TPA-PG)-IPDI-HEMA | DSM |
| Oligomer D5 ("D5") | Oligomer | Trifunctional urethane methacrylate oligomer; Mn = 1915 Da, PDI = 4.39 | DSM |
| Oligomer IP1 ("IP1") | Oligomer | Monofunctional urethane methacrylate oligomer; Mn = 1724 Da, PDI = 1.66 | DSM |
| Oligomer IP2 ("IP2") | Oligomer | Difunctional urethane methacrylate oligomer; Mn = 4017 Da, PDI = 1.81; | DSM |
| BisGMA | Network Building Agent ("NBA") | bisphenol A-glycidyl methacrylate; CAS # 1565-94-2 | PL Industries |
| Miramer M241 ("M241") | NBA | Bisphenol A $(EO)_4$ dimethacrylate; CAS # 41637-38-1 | Miwon Specialty Chemical |
| Genomer G4247 ("UDMA") | NBA | Mixture of isomers of diurethane dimethacrylate; CAS # 72869-86-4 | Rahn AG |
| HIH | NBA | BisHEMA IPDI; CAS # 42405-01-6 | DSM |
| TEGDMA | NBA | triethylene glycol dimethacrylate; CAS # 109-16-0 | Sigma Aldrich |
| TMPTMA | NBA | trimethylolpropane trimethacrylate; CAS # 3290-92-4 | Sigma Aldrich |
| GEO Bisomer HPMA ("HPMA") | Diluent Monomer | 2-Hydroxypropyl methacrylate; CAS # 27813-02-1 | Geo Specialty Chemicals |
| Benzyl methacrylate ("BMA") | Diluent Monomer | CAS # 2495-37-6 | TCI Chemicals |
| Irgacure 819 (BAPO) | Photoinitiator | CAS # 162881-26-7 | Ciba |

TABLE 2A oligomer reactants

| Component | Chemical Descriptor | Supplier |
|---|---|---|
| IPDI | Isophorone diisocyanate; CAS # 4098-71-9 | Evonik |
| PEG200 | Polyethylene Glycol (Mw = 200) diol | Sino-Japan |
| CAPA 2054 ("2054") | Polycaprolactone (Mw = 540) diol | Perstorp |
| CAPA 3091 ("3091") | Polycaprolactone (Mw = 900) triol | Perstorp |
| CAPA 2201A ("2201A") | Polycaprolactone (Mw = 2000) diol | Perstorp |
| TPAPG | Terephthalic acid reacted with propylene glycol | DSM |
| PLACCEL FM1D ("FM1D") | Caprolactone (1 molar) hydroxyethyl methacrylate (IUPAC: 2-Oxepanone'homopolymer'2-[2-methyl-(1-oxo-2-propenyl)oxy]-ethylester) Mw = 244 | Daicel Chemical Industries |
| PLACCEL FM2D ("FM2D") | Caprolactone (2 molar) hydroxyethyl methacrylate (IUPAC: 2-Oxepanone'homopolymer'2-[2-methyl-(1-oxo-2-propenyl)oxy]-ethylester) Mw = 358 | Daicel Chemical Industries |
| PLACCEL FM5 ("FM5") | Caprolactone (5 molar) hydroxyethyl methacrylate (IUPAC: 2-Oxepanone'homopolymer'2-[2-methyl-(1-oxo-2-propenyl)oxy]-ethylester) Mw = 701 | Daicel Chemical Industries |

TABLE 2A-continued oligomer reactants

| Component | Chemical Descriptor | Supplier |
|---|---|---|
| TIB 716 | Bismuth-based liquid catalyst | TIB Chemicals |
| BHT | Butylated hydroxytoluene; CAS # 000128-37-0 | Lanxess |
| HEMA | 2-hydroxyethyl methacrylate: CAS # 868-77-9 | Nippon Shokubai |
| HEA | hydroxy ethyl acrylate; CAS # 818-61-1 | Nippon Shokubai |

TABLE 2B oligomer reactants
Amounts listed in terms of equivalents unless otherwise noted

| | Oligomer | | | | | | | |
|---|---|---|---|---|---|---|---|---|
| Component | C4 | A1 | E2 | U20 | ZC | D5 | IP1 | IP2 |
| IPDI | 4 | 4 | 4 | 4 | 5.4 | 6 | 2 | 4 |
| PEG200 | 2 | | | | | | | |
| 2054 | | 2 | 2 | 2 | | | 2 | |
| 3091 | | | | | | 3 | | |
| 2201A | | | | | | | | 2 |
| TPAPG | | | | | 2.7 | | | |
| FM1D | 2 | | | | | | | |
| FM2D | | | 2 | | | | 1 | |
| FM5 | | | | | | | | 2 |
| HEMA | | 2 | | | 2.7 | 3 | | |
| HEA | | | | 2 | | | | |
| TIB716 | 0.03 wt. % | 0.03 wt. % | 0.03 wt. % | 0.03 wt. % | 0.03 wt. % | 0.03 wt. % | 0.03 wt. % | 0.03 wt. % |
| BHT | 0.08 wt. % | 0.08 wt. % | 0.08 wt. % | 0.08 wt. % | 0.08 wt. % | 0.08 wt. % | 0.08 wt. % | 0.08 wt. % |

Synthesis of Oligomers

The oligomers used in the examples described below were synthesized according to the following protocols:

Oligomer C4

For this inside-out synthesis, the following synthesis steps were used. First, the diisocyanate (IPDI) was charged into a 250 ml reactor (equipped with a stirrer, air inlet, dropping funnel, and condenser). After charging, the reactor was heated to 45 DC before the reactor was purged with dry lean air. Then the specified amount of the polyol (PEG200), was charged into the reactor whilst stirring. After this step the corresponding quantity of TIB 716 was added into the reactor. After 1 hour, the temperature was raised to 60° C. The 60° C. temperature was then further maintained for 2 additional hours. After these 2 hours reaction, the quantity of isocyanate (NCO) content was measured by a potentiometric titrator to ensure it was within 10% of the value of the theoretical isocyanate content that would be derivable for the oligomer from the quantities specified in Table 2B above. Upon confirmation of the appropriate isocyanate content, the appropriate amount of endcap (PLACCEL FM1D) was added to the oligomer, together with the appropriate amount of BHT. Next the temperature was raised to 85° C. The resulting mixture was reacted for 1 hour at 85° C. After this 1-hour reaction, the NCO content was checked via potentiometric titration again. Once the isocyanate content was lower than 0.1% relative to the entire weight of the composition the reaction was considered finished. Finally, the resulting synthesized oligomer was cooled slowly and discharged for use in the experiments described elsewhere herein.

Oligomer A1

For this outside-in synthesis, the following synthesis steps were used. First, the diisocyanate (IPDI) was charged into a 250 nil reactor (equipped with a stirrer, air inlet, dropping funnel, and condenser). After charging, the reactor was heated to 45° C. before the reactor was purged with dry lean air. Then the specified amount of the endcap HEMA, along with the prescribed amount of BHT, was charged into the reactor whilst stirring. After this step the corresponding quantity of TIB 716 was added into the reactor. After 1 hour, the temperature was raised to 60° C. The 60° C. temperature was then further maintained for 2 additional hours. After these 2 hours reaction, the quantity of isocyanate (NCO) content was measured by a potentiometric titrator to ensure it was within 10% of the value of the theoretical isocyanate content that would be derivable for the oligomer from the quantities specified in Table 2B above. Upon confirmation of the appropriate isocyanate content, the appropriate amount of polyol (CAPA 2054) was added to the oligomer. Next the temperature was raised to 85° C. The resulting mixture was reacted for 1 hour at 85° C. After this 1-hour reaction, the NCO content was checked via potentiometric titration again. Once the isocyanate content was lower than 0.1% relative to the entire weight of the composition the reaction was considered finished. Finally, the resulting synthesized oligomer was cooled slowly and discharged for use in the experiments described elsewhere herein.

Oligomer E2

For this outside-in synthesis, the following synthesis steps were used. First, the diisocyanate (IPDI) was charged into a 250 ml reactor (equipped with a stirrer, air inlet, dropping funnel, and condenser). After charging, the reactor was heated to 45° C. before the reactor was purged with dry lean air. Then the specified amount of the endcap (PLACCEL FM2D) with the prescribed amount of BHT, was charged into the reactor whilst stirring. After this step the corresponding quantity of TIB 716 was added into the reactor. After 1 hour, the temperature was raised to 60° C. The 60° C. temperature was then further maintained for 2 additional hours. After these 2 hours reaction, the quantity of isocyanate (NCO) content was measured by a potentiometric titrator to ensure it was within 10% of the value of the theoretical isocyanate content that would be derivable for the oligomer from the quantities specified in Table 2B above. Upon confirmation of the appropriate isocyanate content, the appropriate amount of polyol (CAPA 2054) was added to the oligomer. Next the temperature was raised to 85° C. The resulting mixture was reacted for 1 hour at 85° C. After this 1-hour reaction, the NCO content was checked via potentiometric titration again. Once the isocyanate content was lower than 0.1% relative to the entire weight of the composition the reaction was considered finished. Finally, the resulting synthesized oligomer was cooled slowly and discharged for use in the experiments described elsewhere herein.

Oligomer U20

For this outside-in synthesis, the following synthesis steps were used. First, the diisocyanate (PM) was charged into a 250 ml reactor (equipped with a stirrer, air inlet, dropping funnel, and condenser). After charging, the reactor was heated to 45° C. before the reactor was purged with dry lean air. Then the specified amount of an acrylate endcap (HEA) with the appropriate amount of BHT, was charged into the reactor whilst stirring. After this step the corresponding quantity of TIB 716 was added into the reactor. After 1 hour, the temperature was raised to 60° C. The 60° C. temperature was then further maintained for 2 additional hours. After these 2 hours reaction, the quantity of isocyanate (NCO) content was measured by a potentiometric titrator to ensure it was within 10% of the value of the theoretical isocyanate content that would be derivable for the oligomer from the quantities specified in Table 29 above. Upon confirmation of the appropriate isocyanate content, the appropriate amount of polyol (CAPA 2054) was added to the oligomer. Next, the temperature was raised to 85° C. The resulting mixture was reacted for 1 hour at 85° C. After this 1-hour reaction, the NCO content was checked via potentiometric titration again. Once the isocyanate content was lower than 0.1% relative to the entire weight of the composition the reaction was considered finished. Finally, the resulting synthesized oligomer was cooled slowly and discharged for use in the experiments described elsewhere herein.

Oligomer D5

For this outside-in synthesis, the following synthesis steps were used. First, the diisocyanate (IPDI) was charged into a 250 ml reactor (equipped with a stirrer, air inlet, dropping funnel, and condenser). After charging, the reactor was heated to 45° C. before the reactor was purged with dry lean air. Then the specified amount of the endcap (HEMA) with the appropriate amount of BHT, was charged into the reactor whilst stirring. After this step the corresponding quantity of TIB 716 was added into the reactor. After 1 hour, the temperature was raised to 60° C. The 60° C. temperature was then further maintained for 2 additional hours. After these 2 hours reaction, the quantity of isocyanate (NCO) content was measured by a potentiometric titrator to ensure it was within 10% of the value of the theoretical isocyanate content that would be derivable for the oligomer from the quantities specified in Table 2B above. Upon confirmation of the appropriate isocyanate content, the appropriate amount of polyol (CAPA 3091) was added to the oligomer. Next the temperature was raised to 85° C. The resulting mixture was reacted for 1 hour at 85° C. After this 1-hour reaction, the NCO content was checked via potentiometric titration again. Once the isocyanate content was lower than 0.1% relative to the entire weight of the composition the reaction was considered finished. Finally, the resulting synthesized oligomer was cooled slowly and discharged for use in the experiments described elsewhere herein.

Oligomer IP1

For this outside-in synthesis, the following steps were used. First, the diisocyanate (IPDI) was charged into a 250 ml reactor (equipped with a stirrer, air inlet, dropping funnel, and condenser). After charging, the reactor was heated to 45° C. before the reactor was purged with dry lean air. Then the specified amount of the endcap (PLACCEL FM2D) with the appropriate amount of BHT, was charged into the reactor whilst stirring. Alter this step the corresponding quantity of TIB 716 was added into the reactor. After 1 hour, the temperature was raised to 60° C. The 60° C. temperature was then further maintained for 2 additional hours. After these 2 hours reaction, the quantity of isocyanate (NCO) content was measured by a potentiometric titrator to ensure it was within 10% of the value of the theoretical isocyanate content that would be derivable for the oligomer from the quantities specified in Table 2I3 above. Upon confirmation of the appropriate isocyanate content, the appropriate amount of polyol (CAPA 2054) was added to the oligomer. Next the temperature was raised to 85° C. The resulting mixture was reacted for 1 hour at 85° C. After this 1-hour reaction, the NCO content was checked via potentiometric titration again. Once the isocyanate content was lower than 0.1% relative to the entire weight of the composition the reaction was considered finished. Finally, the resulting synthesized oligomer was cooled slowly and discharged for use in the experiments described elsewhere herein.

Oligomer IP2

For this outside-in synthesis, the following synthesis steps were used. First, the diisocyanate (IPDI) was charged into a 250 nil reactor (equipped with a stirrer, air inlet, dropping funnel, and condenser). After charging, the reactor was heated to 45° C. before the reactor was purged with dry lean air. Then the specified amount of the endcap (PLACCEL FM5) with the appropriate amount of BHT, was charged into the reactor whilst stirring. After this step the corresponding quantity of TIB 716 was added into the reactor. After 1 hour, the temperature was raised to 60° C. The 60° C. temperature was then further maintained for 2 additional hours. After these 2 hours reaction, the quantity of isocyanate (NCO) content was measured by a potentiometric titrator to ensure it was within 10% of the value of the theoretical isocyanate content that would be derivable for the oligomer from the quantities specified in Table 2B above. Upon confirmation of the appropriate isocyanate content, the appropriate amount of polyol (CAPA 2201A) was added to the oligomer. Next the temperature was raised to 85° C. The resulting mixture was reacted for 1 hour at 85° C. After this 1-hour reaction, the NCO content was checked via potentiometric titration again. Once the isocyanate content was lower than 0.1©% relative to the entire weight of the composition the reaction was considered finished. Finally, the resulting synthesized oligomer was cooled slowly and discharged for use in the experiments described elsewhere herein.

Formulations 1-22

Various examples were then formulated by using combinations of the formulation constituents described above and listed in Table 1. Such formulations were prepared in 100 g increments utilizing a protocol which began by heating the relevant specified oligomer overnight to a temperature of between 55-60° C. Then the oligomer was added to a 100 g FlackTek mixing container. With the addition of the oligomer complete, the remainder of the formulation ingredients were then added individually to the mixing container in the amounts specified per individual example as prescribed in Table 3 below. The order of addition of the remaining formulation ingredients is not thought to have any appreciable effect on the final formulation properties or behavior. With all prescribed components added, the entire formulation present in the mixing container was moved to an oven which had been pre-heated to 60° C. The jar remained in said oven for a period of between two to three hours, after which the mixing container was removed from the oven. Immediately after removal, the contents were stirred by hand. Mixing continued until it was visibly apparent that the materials had been thoroughly mixed, in accordance with knowledge well within the person of ordinary skill in the art to which this invention applies. Next, the mixing container was allowed to cool at room temperature for two additional hours. After this cooling period, the mixing jar was placed in a FlackTek SpeedMixer™ which was then set to 2800 revolutions per minute. The mixer was allowed to operate at this rotational velocity for one minute, after which the mixing container was removed. Finally, the formulation was hand-stirred with a spatula for at least 1 additional minute to assure appropriate mixing of all formulation components. The final formulation was transferred into an opaque metal canister. The specific contents and proportion of constituents of each of the examples is specified below in Table 3.

Next, the data collected for each formulation was analyzed. The SLA Viper top-down system was modeled using the working curve equation below:

$$C_d = D_p * \ln\left(\frac{E_{Max}}{E_c}\right)$$

In this equation, $C_d$ is "cure depth", in mils. This semilog plot of $C_d$ vs $E_{Max}$ is a straight line, called a "working curve", where the slope and intercept are penetration depth and Ec (critical exposure), respectively. On this plot, the coordinates at each point can be described as <D, $E_d$>, in mils and millijoules per square centimeter, respectively. $E_d$ translates into the energy required to cure resin into a layer "d" mils thick. Finally, the parameter $E_{10}$ from a working curve plot was determined and recorded using linear regression of real data from experimentation on the SLA system used. All experiments were conducted 2-3 times to ensure consistency. The E10 values for each formulation were recorded and are presented in Table 4A below under the column headed by the designation $E_{10}$. Units are provided in terms of millijoules per square centimeter.

For all working curve experiments described in Table 4A below, feasibility of 3D printing using top-down SLA was determined to have a threshold at $E_{13} \leq 200$ mJ/cm². This threshold was determined through general knowledge of commercial SLA resins and the most basic demands of the technology by industry, as well as concerns regarding decomposition of the resin due to excessive energy input. The qualitative designation of "printable", "marginal", and "not printable" were employed based on this threshold. All "printable" examples met this threshold. All "marginal" examples were within 150 mJ/cm² of meeting this threshold and may be commercially printable in a normal oxygen-rich 3D printing process with some reasonable optimization. All

TABLE 3

| Formulations 1-13. Amounts listed in parts by weight. | | | | | | | | | | | | | | | | |
|---|---|---|---|---|---|---|---|---|---|---|---|---|---|---|---|---|
| # | C4 | A1 | E2 | U20 | ZC | D5 | IP1 | IP2 | BisGMA | M241 | UDMA | HIH | TEGDMA | TMPTMA | HPMA | BMA | BAPO |
| 1 | 50 | 0 | 0 | 0 | 0 | 0 | 0 | 0 | 0 | 0 | 17 | 0 | 0 | 0 | 30.5 | 0 | 2.5 |
| 2 | 0 | 0 | 0 | 0 | 50 | 0 | 0 | 0 | 0 | 0 | 15 | 0 | 0 | 0 | 0 | 32.5 | 2.5 |
| 3 | 50 | 0 | 0 | 0 | 0 | 0 | 0 | 0 | 0 | 0 | 0 | 0 | 0 | 0 | 47.5 | 0 | 2.5 |
| 4 | 50 | 0 | 0 | 0 | 0 | 0 | 0 | 0 | 0 | 0 | 1 | 0 | 0 | 0 | 46.5 | 0 | 2.5 |
| 5 | 50 | 0 | 0 | 0 | 0 | 0 | 0 | 0 | 0 | 0 | 3 | 0 | 0 | 0 | 44.5 | 0 | 2.5 |
| 6 | 50 | 0 | 0 | 0 | 0 | 0 | 0 | 0 | 0 | 0 | 8 | 0 | 0 | 0 | 39.5 | 0 | 2.5 |
| 7 | 50 | 0 | 0 | 0 | 0 | 0 | 0 | 0 | 0 | 0 | 15 | 0 | 0 | 0 | 32.5 | 0 | 2.5 |
| 8 | 50 | 0 | 0 | 0 | 0 | 0 | 0 | 0 | 0 | 0 | 20 | 0 | 0 | 0 | 27.5 | 0 | 2.5 |
| 9 | 20 | 0 | 0 | 0 | 0 | 0 | 0 | 0 | 0 | 0 | 15 | 0 | 0 | 0 | 62.5 | 0 | 2.5 |
| 10 | 70 | 0 | 0 | 0 | 0 | 0 | 0 | 0 | 0 | 0 | 15 | 0 | 0 | 0 | 12.5 | 0 | 2.5 |
| 11 | 50 | 0 | 0 | 0 | 0 | 0 | 0 | 0 | 0 | 0 | 15 | 0 | 0 | 0 | 32.5 | 0 | 2.5 |
| 12 | 50 | 0 | 0 | 0 | 0 | 0 | 0 | 0 | 15 | 0 | 0 | 0 | 0 | 0 | 32.5 | 0 | 2.5 |
| 13 | 50 | 0 | 0 | 0 | 0 | 0 | 0 | 0 | 0 | 15 | 0 | 0 | 0 | 0 | 32.5 | 0 | 2.5 |

| Formulations 14-22. Amounts listed in parts by weight. | | | | | | | | | | | | | | | | |
|---|---|---|---|---|---|---|---|---|---|---|---|---|---|---|---|---|
| # | C4 | A1 | E2 | U20 | ZC | D5 | IP1 | IP2 | BisGMA | M241 | UDMA | HIH | TEGDMA | TMPTMA | HPMA | BMA | BAPO |
| 14 | 50 | 0 | 0 | 0 | 0 | 0 | 0 | 0 | 0 | 0 | 0 | 0 | 15 | 0 | 32.5 | 0 | 2.5 |
| 15 | 50 | 0 | 0 | 0 | 0 | 0 | 0 | 0 | 0 | 0 | 0 | 0 | 0 | 15 | 32.5 | 0 | 2.5 |
| 16 | 50 | 0 | 0 | 0 | 0 | 0 | 0 | 0 | 0 | 0 | 0 | 15 | 0 | 0 | 32.5 | 0 | 2.5 |
| 17 | 0 | 50 | 0 | 0 | 0 | 0 | 0 | 0 | 0 | 0 | 15 | 0 | 0 | 0 | 32.5 | 0 | 2.5 |
| 18 | 0 | 0 | 0 | 50 | 0 | 0 | 0 | 0 | 0 | 0 | 15 | 0 | 0 | 0 | 32.5 | 0 | 2.5 |
| 19 | 0 | 0 | 50 | 0 | 0 | 0 | 0 | 0 | 0 | 0 | 15 | 0 | 0 | 0 | 32.5 | 0 | 2.5 |
| 20 | 0 | 0 | 0 | 0 | 0 | 0 | 0 | 50 | 0 | 0 | 15 | 0 | 0 | 0 | 32.5 | 0 | 2.5 |
| 21 | 0 | 0 | 0 | 0 | 0 | 50 | 0 | 0 | 0 | 0 | 15 | 0 | 0 | 0 | 32.5 | 0 | 2.5 |
| 22 | 0 | 0 | 0 | 0 | 0 | 0 | 50 | 0 | 0 | 0 | 15 | 0 | 0 | 0 | 32.5 | 0 | 2.5 |

Next, working curve measurements of each of formulations 1-22 were created to assess each formulation's potential suitability for use in certain additive fabrication processes. Formulations having determined values deemed suitable for use in top-down, oxygen-rich additive manufacturing processes (such as stereolithography processes) were then further evaluated for various mechanical properties of cured products resulting therefrom, as described according to the test methods listed below. The qualitative and quantitative results of this evaluation are reproduced in summary in Tables 4A, 4B, and 4C.

Working Curve Measurements and Printability Determination

To determine working curves, a portion of the liquid resin corresponding to each formulation (as described in Table 3A above) was placed in a petri dish and temperature equilibrated at 30° C. in a stereolithography (SLA) printer equipped with a UV light source (SLA Viper from 3D Systems, Inc. was used). With a known input of Ec and Dp, the liquid resin was exposed to UV irradiation and six wedges of various thicknesses were generated. The laser power (in milliwatts) and laser speed (in inches per second) were recorded. Wedges were placed onto a 10-mil mylar sheet and excess of liquid resin were removed. Thicknesses of wedges were measured by a Mitutoyo absolute digimatic indicator (model ID-C112CE) for calculation of predicted E10.

"not printable" examples did not meet this threshold by a margin exceeding 150 mJ/cm², and were therefore deemed to be not readily printable in a conventional oxygen-rich (i.e. latent oxygen in the curing environment exceeds 50% of the ambient oxygen in air) 3D printing process.

TABLE 4A

Printability

| Formulation | $E_{10}$ (mJ/cm²) | Printability (top-down SLA) |
|---|---|---|
| 1 | 115.1 | Printable |
| 2 | 112.1 | Printable |
| 3 | 1007.6 | Not Printable |
| 4 | 910.7 | Not Printable |
| 5 | 890 | Not Printable |
| 6 | 339.8 | Marginal |
| 7 | 117.3 | Printable |
| 8 | 103.5 | Printable |
| 9 | 2078.9 | Not Printable |
| 10 | 47.9 | Printable |
| 11 | 117.3 | Printable |
| 12 | 142.3 | Printable |
| 13 | 247.5 | Marginal |
| 14 | 642.8 | Not Printable |
| 15 | 474.8 | Not Printable |
| 16 | 143.2 | Printable |
| 17 | 147.2 | Printable |
| 18 | 253.2 | Marginal |
| 19 | 248.6 | Marginal |
| 20 | 1177.1 | Not Printable |
| 21 | 97.8 | Printable |
| 22 | 834.5 | Not Printable |

At least the formulations assigned printability ratings of "Marginal" or "Printable" and as reported in Table 4A above were evaluated further for mechanical property performance as described below.

Test Strip Creation using DLP Working Curve Method

In order to create test strips to be used in the subsequently described FTIR and DMTA tests, cured products from the relevant formulation were created in an Origin 385 nanometer DLP printer having a build envelope of 144 mm×81 mm×320 mm. Unless otherwise specified, 6 strips of each sample were assembled in center using Netfabb® additive manufacturing software from Autodesk.

Each of the 6 strips were programmed in Netfabb to possess a length of 40 mm and a width of 6.35 mm. Meanwhile, each of the 6 successive strips was programmed in Netfabb to possess a height input from 0.1 to 0.6 mm in 0.1 successive increments for each strip. The height on Netfabb was inputted purely to control the number of layers in exposure, and not to designate an intended height of the final fabricated structure.

Next, in addition to a resolution setting of 0.1 mm/layer and a setting of 2 burn-in layers after the initial layer, the following additional resin settings were created using Origin software controls:

| | Layer | | | | | |
|---|---|---|---|---|---|---|
| Parameter | 1 | 2 | 3 | 4 | 5 | 6 |
| Exposure Delay | 3 sec | 0 sec | 0 sec | 0 sec | 0 sec | 0 sec |
| Exposure Duration | 1 sec | 1.5 sec | 1.5 sec | 2.5 sec | 2.5 sec | 2.5 sec |
| Separation Distance | 0 sec | 0 sec | 0 sec | 0 sec | 0 sec | 0 sec |

Under Origin Machine Settings, the light intensity score was also set to "700" for an overall exposure intensity of 7 mW/cm². This exposure intensity was determined by creating a curve created in conjunction with several additional actions. Such actions included a removal of the build platform and the use of Origin Machine software to set the light intensity score (200-800 at 50 interval). Additionally, a PD300 sensor (Ophir) was placed at the bottom of the resin vat in accordance with the sensor manufacturer's guidelines. Next, the build was started, and the light intensity measured through a radiometer. Finally, a calibration plot was created. The total exposure time for each of the 6 strips was prescribed as follows:

| Strip | Intensity | Exposure |
|---|---|---|
| 1 | 7 | 11.5 |
| 2 | 7 | 9.0 |
| 3 | 7 | 6.5 |
| 4 | 7 | 4.0 |
| 5 | 7 | 2.5 |
| 6 | 7 | 1.0 |

In order to run the experiment, several further guidelines were followed:
  Remove build platform and vat from Origin machine
  Cover projecting glass with single sheet of white printer paper. Trace edges of projecting glass onto printer paper using a pencil.
  Run build and resin sequence on machine. Total sequence should take about 30 seconds. The pattern projection of the six strips should be easily observed.
  Draw boundary box around all six strips onto white paper. Run build+resin sequence multiple times if necessary to ensure that boundary box is accurate.
  Position petri dish lid (0.835 mm thickness)

The results were recorded and samples with thickness closest to 0.35 mm were picked for subsequent DMTA analysis.

Infrared Spectroscopy

The software used for all FTIR experiments was OMNIC8.3.103 by Thermo Fisher Scientific. The FTIR instrument used was the Nicolet 4700 by the Thermo Electron Corp. The number of scans used for both blank and experimental samples was 32. The resolution was kept at 4, with data spacing at 1.928 cm⁻¹. The final format used was "Absorbance" mode, with no corrections used.

The bench calibration used a min/max method, with Loc 2048 used as a reference. The minimum in the calibration was −6.82, with maximum being 7.65. The range assessed was 400-4000 cm⁻¹.

For each sample, both the liquid resin, as well as a cured solid strip produced therefrom (the process for creating such strip described above), was evaluated as described below.

Liquid Resin: First, the stage was wiped with acetone, and checked to ensure that it was clean and dry. The background was collected on air. After collecting background, all samples were assessed sequentially. A droplet of sample was dispensed from a spatula onto the IR crystal. The sample IR spectrum was then read and saved.

Solid Strip: The background was collected in the same manner as described above in the preceding paragraph. The DLP working curve sample closest to 0.375 mm in thickness was selected for both DMTA and IR analysis. The sample was placed on the IR detector (face up/down) and tested.

Analysis: For each FTIR spectrum generated, areas under the curve were calculated for the following regions: Peak 1704 cm$^{-1}$ (Low: 1656.570, High 1781.931); Peak 1637 cm$^{-1}$ (Low 1616.081, High 1648.87); Peak 815 cm$^{-1}$ (Low 800.326, High 825.397).

All samples were blotted dry with isopropyl alcohol (IPA). Green and Post-Cured samples were measured against liquid resin. Post-curing was performed using following methodology: Parts were arranged on a clean glass platform. The platforms were placed in a 3D) Systems PCA oven with ten 40 Watt and 0.88 Ampere long fluorescent bulbs arranged five to a side, with broad wavelength (see below [160]) for 30 minutes. The parts were then flipped and cured for another 30 minutes. The platforms, still carrying the parts after UV postcure, were placed in a thermal oven set at 100° C. for 1 hour. Parts were removed, inserted into a labeled open-faced bag, and placed in a controlled environment at 22-23° C. and 54-55% relative humidity for 24-48 hours.

To determine FUR conversion, the following methodology was used: The peak 1704 cm$^{-1}$ is a non-reactive reference peak which describes a C=O carbonyl stretch. 1637 cm$^{-1}$ and 815 cm$^{-1}$ are acrylate/methacrylate functional peaks. The area under the curve of these functional peaks will decrease with increasing conversion.

For all curves (liquid and cured samples) The area under the curve for 1637 cm$^{-1}$ and 815 cm$^{-1}$ were each divided by the area under the curve for 1704 cm$^{-1}$ measured on the same FTIR spectrum. Dividing the reactive peak with a reference peak on the same spectrum reduces the effect of random fluctuations in the baseline of the measured FTIR spectrum. This creates two "conversion peaks". To determine overall conversion, the following equation is applied: [conversion peak (liquid sample)−conversion peak (cured sample)]/[conversion peak (liquid sample)]

This equation was applied for both conversion peaks 1637 cm$^{-1}$ and 815 cm$^{-1}$. The final value was then averaged. Values for conversion for the samples, both in the green and post-cured state were recorded and are reproduced in relevant part under the columns headed by "IR Green" and "IR Post" in Table 4B below, respectively. The units are in terms of % unless otherwise noted.

Dynamic Mechanical Analysis

DMTA testing was then used to determine further mechanical properties of the cured product produced from select formulations. The machine used for this process was a TA Instruments RSA 3. The software used was TA Orchestrator 8500-0114 (Firmware RSA 1.06.00).

Samples selected from DLP working curve experiments which closely match a desired strip thickness of 0.325 mm were used for all experiments. After gap check, the instrument clamps were set at a distance of 20.00 mm apart. The sample width was measured, and the sample was inserted between the clamps. The machine was set with a pre-tension between 20 and 50 Newtons. All measurements were input. The DMTA experiments were run from an initial temperature of 20° C. to 120° C. or from −20° C. to 80° C. at a ramp rate of 3° C./min and at a frequency of 6.2832 rails. A 30 second soak time was set after ramp. One data point was collected every 30 seconds. Strain was maintained at 0.05%.

The maxima of tan (δ (expressed as a dimensionless ratio of E"/E' unless otherwise noted) and/or maxima of E" (expressed in ° C. unless otherwise noted) were both measured. E" values, which may be used to approximate the glass transition temperature of the specified material, were recorded and are reproduced in Table 4B below under the heading "E"."

Tensile Testing

Next, tensile testing was conducted with respect to cured products created from several of the formulations utilized. All tensile testing was performed using an MIS Criterion Model 43. The software used to analyze and extract data was a TW Elite, version 4.2.3.746. All experiments were performed as static plastic tensile tests, without an extensiometer, using a 50 kN load cell. Each set of experiments were performed using 5-7 tensile specimens, fabricated identically.

Inputs into the machine were as follows: Gage length for all samples was kept constant at 9.53 mm, consistent with the gage length for a typical ASTM Type V Tensile Bar. Tensile elongation rate was kept constant at 0.1 mm/s. Temperature was maintained between 22° C. and 23° C., with a relative humidity recorded between 54% and 55% for all experiments. Temperature and humidity were read using Jumbo Temperature Humidity Meter (from Traceable). The span width and thickness were measured at the center of each specimen using a Mitutoyo Absolute Digimatic Metal Caliper and input into the software.

ASTM Type V Tensile bars were used for all tensile testing measurements reported in Table 4B herein. The default Type V option on Netfabb was selected with a thickness modified to 1.000 mm.

For formulations under the column heading "Print Method" designated as "DLP", 1 mm thick ASTM Type V tensile bars were printed on an EnvisionTEC Perfactory Micro DLP machine. For the sample with the designation "SLA," meanwhile, the same 1 mm thick ASTM Type V tensile bar was printed on a 3D Systems SLA Viper system.

For each formulation where specified, a total of three (3) ASTM V tensile bars per build were staged on the EnvisionTEC Perfactory Micro bottom-up DLP machine using EnvisionTEC onboard software. Each layer was exposed to 405 nm light at 4 mW/cm$^2$ for 9 seconds. The machine was operated in accordance with manufacturer guidelines. 3D printed parts were removed by leveraging a blade underneath each tensile bar and peeling the tensile bars off the platform. For each tested sample, the tensile build was run twice, to procure six tensile bars per experiment.

For the SLA Viper tensile bar build, meanwhile, a total of 15 tensile bars were oriented perpendicular to the zephyr blade in two rows. The row closest to the front of the platform contained eight bars. The second row contained seven bars. All parts were positioned at 0.3 inches in the Z plane. Parts were prepared in 3D Lightyear version 1.5. Parts were supported with 5 degrees of minimum support angle. Parts imaged with +1 HOC and built at a 4-mil layer thickness. A clean platform was loaded onto the 3D Systems Viper machine. The recoater blade was wiped clean with isopropyl alcohol. A gap check was conducted and the recoater blade was adjusted accordingly. Clean latex gloves were used for every interaction involving the 3D Printer and its associated components. A gap check was conducted and the recoater blade aligned with the gap blocks to ensure accuracy and quality. Components were printed using build/resin settings relevant to the resin. Tensile bars were staged on the Viper such that one build was performed with 15 tensile bars. Resin was allowed to equilibrate to 30° C. over 120 minutes prior to printing. The input Ec and Dp values were 18.5 mJ/cm$^2$ and 4.5 mils, respectively.

Then, prior to mechanical analysis, all tensile bars (whether printed via DLP or SLA method) were post-processed according to the following method:

A clean 1 L nalgene bottle was filled with 99.7% isopropyl alcohol (IPA) such that the mass ratio of IPA to printed part was 40:1. 3D printed parts were added to the nalgene bottle, and the bottle was continuously agitated for 5 minutes. Parts were then removed, rinsed with IPA, and dried by hand towel.

Parts were arranged on a clean glass platform. The platforms were placed in a 3D Systems PCA oven with ten 40 Watt and 0.88 Ampere long fluorescent bulbs arranged five to a side, with broad wavelength (see below [179]) for 30 minutes. The parts were then flipped and cured for another 30 minutes. The platforms, still carrying the parts after UV postcure, were placed in a thermal oven set at 100° C. for 1 hour. Parts were removed, inserted into a labeled open-faced bag, and placed in a controlled environment at 22-23° C. and 54-55% relative humidity for 24-48 hours.

With the parts appropriately post-processed, evaluation of Tensile Modulus, Yield Stress, Elongation at Yield, Elongation at Break, and Break Stress was then conducted. The determination of each sample's Tensile Modulus, Yield Stress, Elongation at Yield, and Elongation at Break was performed in accordance with ASTM D638 for the ASTM Type V specimens. Tensile modulus (reported in Table 4B under the column headed by "Modulus"), Yield Stress, and Break Stress are reported in units of Megapascals (MPa), rounded to the nearest tenth's place, unless otherwise noted. Elongation at Yield and Elongation at Break (reported in Table 413 under the columns headed by "EAY" and "EAB," respectively) are unitless, but represent measurements taken on a mm/mm basis.

The results were recorded and are reproduced in relevant part in Table 4B below.

to 0.85 rum were 3D printed on a top-down 3D Systems SLA Viper. The vat and recoater blade were cleaned using ordinary methods to ensure no cross-contamination of resin. Parts were cleaned in a 40:1 weight ratio of isopropyl alcohol to printed part. Parts were arranged on a clean glass platform and placed in a 3D Systems PCA oven with ten 40 Watt and 0.88 Ampere long fluorescent bulbs arranged five to a side, with broad wavelength (FIG. 3) for 30 minutes. Prior to use, the PCA oven was wiped down with isopropyl alcohol. The platforms, still carrying the parts after UV postcure, were placed in a thermal oven that was wiped down with acetone and isopropyl alcohol using "kimwipes". The thermal oven was set at 100° C. for 2 hours. There were gradual ramp-up and ramp-down times.

The cytotoxicity testing was then performed on extracts of 3D printed parts. The extractions were performed at 37±1° C. for 72±2 hours with agitation in the media in accordance with ISO 010993-12 standards, current in March 2018. Cell culture media was replaced by 100 uL of extract and the appropriate positive or negative control and incubated with the fibroblasts at 37 for 24-26 hrs. Then 20 uL of MTS solution that is bioreduced by living cells only and is accompanied by a color change. After incubation at 37 C for a further 120-135 minutes the optical density was measured at 492 nm. A reduction of >30% in cell viability i.e., less than 70% cell viability is regarded as cytotoxic. The mammalian cell line used was mouse L929 fibroblast cells.

TABLE 4B

Mechanical Properties

| Formulation | Print Method | IR Green | IR Post | E" (° C.) | Modulus (MPA) | Yield Stress (MPA) | EAY (%) | EAB (%) | Break Stress (MPA) |
|---|---|---|---|---|---|---|---|---|---|
| 6 | DLP | No data | | 61.17 | 1117.2 | 86.2 | 12 | 22 | 65.5 |
| 7 | DLP | 0.806 | 0.941 | 61.17 | 1117.2 | 86.2 | 12 | 22 | 65.5 |
| 7 | SLA | 0.280 | 0.881 | 56.84 | 1050.1 | 85.1 | 12 | 24 | 63.5 |
| 8 | DLP | 0.747 | 0.918 | 61.14 | 1030.8 | 87.3 | 12 | 17 | 71.6 |
| 10 | DLP | 0.631 | 0.984 | 52.15 | 1067.0 | 86.6 | 12 | 15 | 72.6 |
| 11 | DLP | 0.806 | 0.941 | 61.17 | 1117.17 | 86.18 | 12 | 22 | 65.45 |
| 12 | DLP | 0.770 | 0.991 | 62.48 | 1197.0 | 96.0 | 12 | 15 | 70.0 |
| 13 | DLP | 0.818 | 1.000 | 61 | 1019.6 | 82.3 | 12 | 18 | 66.5 |
| 16 | DLP | | | | No data | | | | |
| 17 | DLP | 0.802 | 0.987 | 48 | 790.7 | 66.1 | 12 | 36 | 50.5 |
| 18 | DLP | 0.735 | 0.872 | 46.31 | 698.5 | 65.6 | 12 | 82 | 50.6 |
| 19 | DLP | 0.841 | 0.950 | 31.81 | 435.8 | 40.4 | 13 | 155 | 46.7 |
| 20 | DLP | 0.768 | 0.913 | 52.4 | 983.6 | 77.6 | 12 | 32 | 59.1 |

Next, the mechanical properties of two select additional formulations were then evaluated using tensile bars of slightly different geometry. Specifically, ASTM Type I tensile bars were created on an SLA Viper per the same method described above from formulations 1 and 2, respectively. Values for tensile modulus, yield stress, % Elongation at Yield, and % Elongation at Break for at least one of the samples was determined in accordance with ASTM D638, with values reported in Table 4C below. Additionally, formulation 1 was further evaluated for flexural strength via ASTM D790, heat deflection temperature via ASTM D648, and % water absorption in accordance with ASTM D570-98. The results of such evaluations also appear in Table 4C below.

Finally, formulation 1 was subjected to cytotoxicity testing in accordance with ISO10993-5. With respect to this evaluation, the following protocols were observed: 3D printed ASTM Type 1 tensile bars with thickness modified

TABLE 4C

| | | Formulation | |
|---|---|---|---|
| Method | Properties | 1 | 2 |
| ASTM D638 | Tensile modulus (MPa) | 3210 ± 220 | 3038 ± 104 |
| ASTM D638 | Yield Stress (MPa) | 83.1 ± 1.3 | — |
| ASTM D638 | % Elongation at Yield | 4.9 ± 0.1 | — |
| ASTM D638 | % Elongation at break | 20 | 4.9 |
| ASTM D790 | Flexural Strength (MPa) | 100 ± 10 | — |
| ASTM D648 | HDT @ 0.46 MPa (66 psi) | 74 degrees C. | — |
| ASTM D570-98 | % Water Absorption (25 C.) | 1.0 | — |

TABLE 4C-continued

| | | Formulation | |
| --- | --- | --- | --- |
| Method | Properties | 1 | 2 |
| ISO10993-5 | Cytotoxicity (% cell viability) | 98.8 | — |

Discussion of Results

As can be seen from the results depicted in Tables 4A to 4C, various compositions according to the present invention yield one or more of: enhanced printability in select additive fabrication processes, cured articles possessing desirable mechanical properties, and/or excellent biocompatibility characteristics.

From Table 4A, without opining on their suitability for use in all additive fabrication processes, it is evident at least that compositions lacking a network building agent (e.g. formulation 3) entirely, those with a low amount of network building agent (e.g. formulations 4 and 5), those possessing non-preferred. NBAs (e.g. formulations 15 and 16), those possessing low amounts of oligomer (e.g. formulation 9), those with oligomers having a high molecular weight (e.g. formulation 20), or those with a monofunctional oligomer (e.g. formulation 22) are insufficiently suited for processability in an oxygen-rich 31) printing environment.

From Table 4B, it is apparent that compositions according to the present invention also may yield cured articles with consistent and desirable mechanical properties. Specifically, formulation 7 was tested on both an oxygen-rich and oxygen-poor environment (SLA and DLP print methods, respectively). The results show similar mechanical performance regardless of build method in terms of at least multiple properties.

More specifically, it is shown via formulations 3-8 that there is an inverse relationship between the weight concentration of the network build agent (NBA) and the $E_{10}$ value of the formulation with which it is associated. This suggests that the NBA facilitates printability in additive manufacturing processes. Formulations 3, 4, and 5, meanwhile, which contain 0-3% of an NBA, exhibit a lack of printability potential in at least oxygen-rich environments.

Further, it is shown via formulations 9-11 that there is a direct relationship between the amount of difunctional urethane methacrylate oligomer in a formulation and the 3D printability of the formulation with which such oligomer is associated (controlling for NBA content). Specifically, formulation 9, which contains a low oligomer content, exhibits a lack of printability (at least in oxygen-rich build environments) through a very high $E_{10}$ value. Formulations controlled only for higher oligomer content exhibit lower $E_{10}$ values, and therefore enhanced suitability for 3D printing.

Additionally, it is shown from formulations 11-16 that the specific nature of the NBA chosen has an impact upon the printing efficacy of the formulation with which such NBA is associated in an oxygen-rich environment. Formulations 11, 12, and 17 utilize UDMA, BisGMA, UDMA, and HIH, respectively, and are deemed "printable". Formulations 14, and 15 utilize TEGDMA and TMPTMA, respectively, and are deemed "not printable". Formulation 13 utilizes M241 and is "marginal". The results of TEGDMA and TMPTMA is surprising due to the low Mn of TEGDMA (approximately half that of BisGMA, UDMA, and HIH) and the higher functionality of TMPTMA; more crosslinking sites would have been expected to result in a faster curing process. BisGMA, UDMA, and HIH dramatically increase the efficiency of 3D printing an oligomer centric methacrylate formulation in an oxygen rich environment due to a combination of hydrogen-bonding donor sites and aromaticity. Strong hydrogen-bonding donor sites such as urethane, urea, and amide groups will render such formulations printable under normal oxygen-rich conditions. Some degree of hydrogen bonding can be sacrificed with the inclusion of aromaticity—BisGMA has two aromatic groups, weaker hydrogen bonding donor sites (secondary hydroxyls instead of urethane), and formulation 12 is still "printable" though measured to be a bit slower than other successful formulations 11 and 16. The M241 in marginal case formulation 13 maintains aromaticity but loses all hydrogen bond donor sites. Despite a similar molecular weight network building agent as successful formulations 12, 11, and 16, this structural change results in significantly lower $E_{10}$ and therefore a "marginal" printability grading. TEGDMA and TMPTMA have no hydrogen bond donor sites and no aromaticity, leading to poor performance in curing formulations 14 and 15 in oxygen rich environments.

It is shown when comparing formulations 17, 11, and 2 that increasing the glass transition of the urethane methacrylate oligomer affects printability in oxygen rich environments. Formulation 17 uses the oligomer A1, which has an uncured Tg lower than −15° C., as measured by DSC (data not provided). Formulation 11 uses the oligomer C4, which has an uncured Tg between −15° C. and 5C, as measured by DSC (data not provided). Formulation 2, meanwhile, uses the oligomer ZC, which has an uncured Tg above 25° C., as measured by DSC (data not provided). The Mn of these oligomers are comparable, within 400 Daltons. Nonetheless, the calculated $E_{10}$ decreases as the uncured Tg of the urethane methacrylate oligomers in these formulations increases.

It is shown using formulations 17, 19, and 20 that increasing the Mn of urethane methacrylate oligomer has an impact upon the printability of the formulation with which such oligomer is associated in oxygen rich environments. The Mn of the oligomer used in formulation 17 is 1476 Da, and such formulation possesses an $E_{10}$ value of 147 mJ/cm$^2$. The Mn of the oligomer used in formulation 19 is 1944 Da and the $E_{10}$ of the formulation is 248 mJ/cm$^2$, obtaining a rating of "marginally printable". The Mn of the oligomer used in formulation 20, meanwhile, is 4017 Da and the E10 of the formulation is 1177.4 mJ/cm$^2$, obtaining a rating of "not printable".

It is shown by comparing formulation 18 with 21-22 that varying the functionality of urethane methacrylate oligomer also has an impact upon the printability of the composition with which such oligomer is associated. Formulation 21 has a functionality of 3 and an $E_{10}$ of 97.8 mJ/cm$^2$. Formulation 18, meanwhile, has a functionality of 2 and an $E_{10}$ of 147 mJ/cm$^2$. Formulation 22, finally, has a functionality of only 1 and an $E_{10}$ of 834.5 mJ/cm$^2$. The data shows that such a composition would not be printable in an oxygen rich environment.

Unless otherwise specified, the term wt. % means the amount by mass of a particular constituent relative to the entire liquid radiation curable composition for additive fabrication into which it is incorporated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A radiation curable composition for additive fabrication comprising:
    a. from 40 to 95 wt. %, based on the total weight of the composition, of a urethane methacrylate oligomer having at least one polymerizable group,
        wherein the urethane methacrylate oligomer is the reaction product of a diisocyanate, a polyol, and a hydroxy-functional methacrylate, and
        wherein the urethane methacrylate oligomer has a number average molecular weight (Mn) from 750 to 4000 g/mol;
    b. an effective quantity of a monofunctional reactive diluent monomer;
    c. from 2 to 20 wt. %, based on the total weight of the composition, of a methacrylate-functional network building agent (NBA) comprising a number average of greater than 1.5 polymerizable groups;
        wherein at least one of the polymerizable groups of the methacrylate-functional NBA is able to (co)polymerize with the at least one polymerizable group of the urethane methacrylate oligomer, and
        wherein the methacrylate-functional NBA possesses an Mn value that is less than the Mn value of the urethane methacrylate oligomer and higher than the Mn of the reactive diluent monomer;
    d. optionally, one or more photoinitiators; and
    e. optionally, one or more additives;
    wherein Mn is measured by size exclusion chromatography (SEC) calibrated with a polystyrene standard in tetrahydrofuran.

2. The composition according to claim 1, wherein the NBA possesses an Mn value of less than 750 g/mol and further possesses a number average of 1.9 to 3.1 functional groups.

3. The composition according claim 1, wherein the NBA contains an amide, carbamide, ester, hydroxyl, urea, or urethane group.

4. The composition according to claim 3, wherein the NBA contains at least one or both of the following:
    (i) at least two hydrogen bond donor sites not present in a methacrylate group, or
    (ii) at least two aromatic groups.

5. The composition according to claim 4, wherein the hydrogen bond donor sites occur at, or directly adjacent to, a urethane, urea, or amide group.

6. The composition according to claim 1, wherein the urethane methacrylate oligomer possesses an uncured Tg, as measured by differential scanning calorimetry, from −40° C. to 20° C.

7. The composition according to claim 1, wherein the urethane methacrylate oligomer if present by weight, relative to the entire composition, from 50 to 95 wt. %.

8. The composition according to claim 1, wherein the urethane methacrylate oligomer is the reaction product of an aliphatic diisocyanate, a polyol, and a hydroxy-functional methacrylate.

9. The composition according to claim 8, wherein the urethane methacrylate oligomer comprises the reaction product of isophorone diisocyanate, hexane diisocyanate, 2,2,4-trimethyl hexane diisocyanate, 2,4,4-trimethylhexane diisocyanate, pentane diisocyanate or 4,4-methylene bis (cyclohexyl isocyanate), or mixtures thereof.

10. The composition according to claim 8, wherein the urethane methacrylate oligomer comprises the reaction product of a polyol having a molecular weight from 200 to 6000 g/mol, wherein the polyol comprises polyethylene glycol, polypropylene glycol, poly THF, polybutylene oxide, polyethylene co-propylene oxide, or polyethyleneoxide-block-propylene oxide, or mixtures thereof.

11. The composition according to claim 8, wherein the urethane methacrylate oligomer comprises the reaction product of hydroxy ethyl methacrylate, 1-hydroxypropyl methacrylate, 2-hydroxypropyl methacrylate, 1-hydroxybutyl methacrylate, diethylene glycol methacrylate, dipropylene glycol methacrylate, or caprolactone 2-(methacryloyloxy)ethyl ester, or mixtures thereof.

12. The composition according to claim 8, wherein the urethane methacrylate oligomer comprises the reaction product of polycaprolactone diol, wherein the polycaprolactone diol further comprises a primary hydroxyl group.

13. The composition according to claim 1, wherein the urethane methacrylate oligomer comprises a number average from 1.9 to 2.1 polymerizable groups.

14. The composition according to claim 13, wherein the polymerizable groups consist of methacrylate functional groups.

15. The composition according to claim 1, wherein the reactive diluent monomer consists of a monofunctional urethane methacrylate compound.

16. The composition according to claim 1, wherein the reactive diluent monomer comprises isopropylideneglycerol methacrylate (IPGMA), (hydroxyethyl)methacrylate (HEMA), 2-hydroxypropyl methacrylate (HPMA), benzyl methacrylate (BMA), cyclohexyl methacrylate, isobornyl methacrylate, or 4-tbutylcyclohexyl methacrylate, THFmethacrylate, phenyl methacrylate, 2,2,4-trmethylcyclohexyl methacrylate, or mixtures thereof.

17. The composition according to claim 1, wherein the methacrylate-functional network building agent (NBA) consists of a methacrylate-functional aliphatic urethane-containing compound.

18. The composition according to claim 1, wherein the methacrylate functional network building agent (NBA) comprises a bisphenol A glycidyl methacrylate, a triethylene glycol dimethacrylate, a trimethylhexamethylene diisocyanate di(hydroxyethyl)methacrylate, or a methacrylate-terminated isocyanate comprising a methacrylate-terminated moiety and an isocyanate moiety.

19. The composition according to claim 18, wherein the methacrylate-terminated moiety comprises (hydroxyethyl) methacrylate or 2-hydroxypropyl methacrylate, and the isocyanate moiety comprises hexamethylene diisocyanate, isophorone diisocyanate, tolulene-diisocyanate, or TMXDItetramethylxylylene diisocyanate.

20. The composition according to claim 1, wherein the methacrylate-functional network building agent (NBA) comprises, consists of, or consists essentially of bisphenol A-glycidyl methacrylate, diurethane dimethacrylate, or a mixture thereof.

21. The composition according to claim 1, wherein the methacrylate-functional network building agent (NBA) comprises a difunctional compound having a number average molecular weight from 150 to 750 g/mol, or from 200 to 500 g/mol.

22. The composition according to claim 1, wherein the additives are present in an amount from 1 to 40 wt. %, relative to the weight of the entire composition, and wherein said additives comprise a filler or impact modifier.

23. A method of producing a three-dimensional part via an additive fabrication process, the method comprising:
 a. providing a first layer of a radiation curable composition, thereby forming a first surface;
 b. optionally, heating at least a portion of the first layer of the radiation curable composition;
 c. exposing at least a portion of the first layer of the radiation curable composition imagewise to actinic radiation to form a cured cross-section;
 d. providing an additional layer of a radiation curable composition onto at least a portion of the cured cross-section to form an additional layer of the radiation curable composition;
 e. exposing at least a portion of the additional layer of the radiation curable composition imagewise to actinic radiation to form an additional cured cross-section;
 f. repeating steps (d) and (e) a plurality of times in order to form a three-dimensional object which is the cured product of the radiation curable composition;
wherein at least one of the first layer or the additional layers of the radiation curable composition is provided in a medium whereby an oxygen content exceeds at least 50% of the ambient oxygen in dry air by volume, and
 the radiation curable composition is defined by the composition according to claim 1.

24. The method according to claim 23, wherein a linear polymer formed from the urethane methacrylate oligomer has a Tg between 30-100° C.

25. The method according to claim 23, wherein the exposing step involves the application of actinic radiation at an irradiance on a surface of the first layer of the radiation curable composition of less than 200 W/cm2.

26. The method according to claim 23, wherein the heating step involves the heating of at least a portion of the first layer to a temperature that is equal to or less than the Tg of a linear polymer formed from the urethane methacrylate oligomer.

27. The method according to the claim 26, wherein the heating step involves the heating of at least a portion of the first layer to a temperature that is within about 15° C. of the Tg of the linear polymer formed by at least one of the urethane methacrylate oligomers.

28. The method according to claim 23, wherein the radiation curable composition comprises, relative to the weight of the entire composition:
 from 50-85 wt. % of an aliphatic urethane methacrylate oligomer having a number average molecular weight from 1000 to 6000 g/mol;
 from 2-20 wt. % of a reactive diluent monomer having a number average from 0.9 to 1.1 methacrylate functional groups;
 from 5-20 wt. %, or 8-20 wt. %, of a difunctional network building agent having a number average molecular weight from 150 to 500 g/mol;
 from 0.1-5 wt. % of a photoinitiator; and
 one or more additives;
wherein the combined weight of the aliphatic urethane methacrylate oligomer, the reactive diluent monomer, the difunctional network building agent, the photoinitiator, and the additives equals 100 wt. %.

29. An article cured from the composition according to claim 1.

30. The article of the preceding claim, further wherein the article, after UV postcure and thermal postcure, possesses the following properties:
 a. a tensile modulus, when tested according to ASTM D638-14, from 2000 MPa to 5000 MPa;
 b. a yield stress, when tested according to ASTM D638, from about 65 MPa to about 120 MPa;
 c. an elongation at yield, when tested according to ASTM D638-14 from about 4% to about 8%;
 d. a flexural strength, when tested according to ASTM D790-17 from about 75 MPa to about 125 MPa;
 e. a heat deflection temperature (HDT), when tested according to ASTM D648 (at 0.46 MPa/66 psi), from about 60 to about 90 degrees Celsius; and
 f. a water absorption, when tested according to ASTM D570-98, at 25 degrees Celsius, from about 0.5 to about 2%.

31. The article of claim 29, wherein the article, when subjected to a cytotoxicity test per ISO 10993-5, and fabricated at a weight of approximately 2 g and a surface area of approximately 52.8 $cm^2$, exhibits a cell viability above 90%.

32. A kit of materials for forming an object by an additive fabrication process comprising:
 a urethane methacrylate oligomer having at least one polymerizable group, wherein the urethane methacrylate oligomer is the reaction product of an isocyanate, a polyol, and a hydroxy-functional methacrylate, and wherein the urethane methacrylate oligomer has a number average molecular weight (Mn) from 750 to 6000 g/mol, as measured by size exclusion chromatography using a polystyrene standard in THF;
 a reactive diluent monomer, wherein the reactive diluent monomer comprises a number average of 0.9 to 1.1 polymerizable groups;
 a methacrylate-functional network building agent (NBA) comprising a number average of greater than 1.5 polymerizable groups; wherein the methacrylate-functional NBA possesses an Mn value that is less than the Mn value of the urethane methacrylate oligomer and greater than the Mn value of the reactive diluent monomer, as measured by size exclusion chromatography with a polystyrene standard in tetrahydrofuran;
one or more photoinitiators; and
optionally, one or more additives.

* * * * *